(12) United States Patent
Mangadlao et al.

(10) Patent No.: US 10,539,875 B2
(45) Date of Patent: Jan. 21, 2020

(54) KETYL RADICAL INDUCED PHOTOREDUCTION OF GRAPHENE OXIDE; GRAFTING OF METAL NANOPARTICLES ON GRAPHENE BY PHOTOREDUCTION

(71) Applicant: CASE WESTERN RESERVE UNIVERSITY, Cleveland, OH (US)

(72) Inventors: Joey D. Mangadlao, Cleveland, OH (US); Rigoberto Advincula, Shaker Heights, OH (US)

(73) Assignee: CASE WESTERN RESERVE UNIVERSITY, Cleveland, OH (US)

( * ) Notice: Subject to any disclaimer, the term of this patent is extended or adjusted under 35 U.S.C. 154(b) by 130 days.

(21) Appl. No.: 15/631,730

(22) Filed: Jun. 23, 2017

(65) Prior Publication Data
US 2017/0369322 A1   Dec. 28, 2017

Related U.S. Application Data

(60) Provisional application No. 62/354,208, filed on Jun. 24, 2016.

(51) Int. Cl.

| | |
|---|---|
| *G03F 7/20* | (2006.01) |
| *B01J 21/18* | (2006.01) |
| *B01J 23/50* | (2006.01) |
| *B01J 23/52* | (2006.01) |
| *B01J 23/44* | (2006.01) |
| *B01J 35/00* | (2006.01) |
| *B01J 37/34* | (2006.01) |
| *B01J 37/16* | (2006.01) |
| *G03F 7/004* | (2006.01) |
| *C08K 3/04* | (2006.01) |
| *C01B 32/215* | (2017.01) |
| *G03F 7/031* | (2006.01) |
| *C01B 32/192* | (2017.01) |
| *C01B 32/194* | (2017.01) |
| *B01J 37/02* | (2006.01) |
| *C08K 3/08* | (2006.01) |
| *B82Y 30/00* | (2011.01) |
| *B82Y 40/00* | (2011.01) |

(52) U.S. Cl.
CPC .......... *G03F 7/2004* (2013.01); *B01J 21/18* (2013.01); *B01J 23/44* (2013.01); *B01J 23/50* (2013.01); *B01J 23/52* (2013.01); *B01J 35/002* (2013.01); *B01J 35/004* (2013.01); *B01J 35/0006* (2013.01); *B01J 35/0013* (2013.01); *B01J 37/0209* (2013.01); *B01J 37/0223* (2013.01); *B01J 37/16* (2013.01); *B01J 37/345* (2013.01); *C01B 32/192* (2017.08); *C01B 32/194* (2017.08); *C01B 32/215* (2017.08); *C08K 3/042* (2017.05); *C08K 3/08* (2013.01); *G03F 7/0042* (2013.01); *G03F 7/0043* (2013.01); *G03F 7/031* (2013.01); *B82Y 30/00* (2013.01); *B82Y 40/00* (2013.01); *C08K 2201/011* (2013.01); *Y10S 977/734* (2013.01); *Y10S 977/842* (2013.01)

(58) Field of Classification Search
CPC ........................................................ G03F 7/20
See application file for complete search history.

(56) References Cited

U.S. PATENT DOCUMENTS

| | | | |
|---|---|---|---|
| 2013/0092904 A1* | 4/2013 | Ushikura ............. | H01L 51/105 257/40 |
| 2016/0280827 A1* | 9/2016 | Anderson ............ | C08F 230/06 |

OTHER PUBLICATIONS

Xue et al., "UV-assisted reduction of graphite oxide to graphene using a photoinitiator", Jan. 2017, J. Mater. Sci. (2017) 52:4866-4877. (Year: 2017).*

Jitaru et al. "Polymer-graphene composites by the photocuring of a system containing benzophenone macromer", 2016, J. Serb. Chem. Soc. 81(9) 1055-1068 (2016). (Year: 2016).*

Zhang et al. "Fabrication of gold nanoparticles/graphene oxide using graphene oxide as reducing agent and their excellent catalytic performance" 2011, Royal Society of Chemistry. (Year: 2011).*

* cited by examiner

*Primary Examiner* — Kathleen Duda
(74) *Attorney, Agent, or Firm* — Hudak, Shunk & Farine Co. LPA

(57) ABSTRACT

Photoreduction of graphene oxide, by UV-generated ketyl radicals, to graphene. The photoreduction is versatile and can be carried out in solution, solid-state, and even in polymer composites. Reduction of graphene oxide can take place in various polymer matrixes. Methods for producing graphene-supported metal nanoparticles by photoreduction. Graphene oxide and a metal nanoparticle precursor are simultaneously reduced by the action of photogenerated ketyl radicals. Photoreduction is performed on polymer composite films in one embodiment.

10 Claims, 19 Drawing Sheets

KETYL RADICAL INDUCED PHOTOREDUCTION OF GRAPHENE OXIDE; GRAFTING OF METAL NANOPARTICLES ON GRAPHENE BY PHOTOREDUCTION

FIELD OF THE INVENTION

The present invention relates to photoreduction of graphene oxide, by UV-generated ketyl radicals, to graphene. The photoreduction is versatile and can be carried out in solution, solid-state, and even in polymer composites. Reduction of graphene oxide can take place in various polymer matrixes. The present invention also relates to methods for producing graphene-supported metal nanoparticles by photoreduction. Graphene oxide and a metal nanoparticle precursor are simultaneously reduced by the action of photogenerated ketyl radicals. Photoreduction is performed on polymer composite films in one embodiment.

BACKGROUND OF THE INVENTION

Polymer-graphene nanocomposites are often inhomogeneous due to their inherent incompatibility. One way to circumvent this dilemma is to use graphene oxide (GO) as a precursor which opens opportunity for the large-scale production of graphene-based materials due to its cost-effective synthesis and solution processability. To re-establish the electronic properties of graphene, the GO should be reduced. Reduction routes such as chemical and high thermal treatment do not only use toxic chemicals but also are not suitable for plastic electronics. Recently, there is a growing interest on photoreduction of GO as a mild and environmentally friendly method. Light-driven reactions are interesting because they afford spatial and temporal control of the process. For instance, the photoreduction of GO is a promising route for the rapid production of photo-patterned circuits which are attractive for electronics industry.

A considerable number of scientific literature have been reported on this topic. However, most of the techniques described utilize inorganic photoreducers or photocatalysts such as $TiO_2$ and $H_3PW_{12}O_{40}$ which rely on the release of electrons from the catalyst that in turn reduce GO. A downside of this approach is the difficulty of removing the inorganic photocatalyst which affects graphene's properties due to contamination. It is worth-noting that there are reports where a photocatalyst is not needed, however, very long irradiation time of up to 48 hours is required. The flash reduction technique using a photographic camera flash is also attractive. However, since the mechanism of reduction relies on photo-thermal heating, this technique is not amenable to solution-based reduction due to fast heat-transfer to the solvent. In addition, other reports on photoreduction are rather complex because the photoreaction has to be performed in $N_2$ and $H_2$ atmosphere or in vacuum. Hence, the development of a simpler, faster and cost-effective photoreduction technique is still an open challenge.

Carbon nanomaterials decorated with metal nanoparticles have important application in the area of catalysis, sensing, fuel cell and other renewable energy-related applications. Over the decades, carbon supported palladium nanoparticles are widely used for heterogeneous catalysis. More recently however, carbon nanotube or graphene supported metal nanoparticles show promising uses for enhanced gas detection, bio-imaging, electrical conductivity, catalytic performance and antimicrobial efficacy. Based on literature, the grafting of these nanoparticles onto carbon supports are made possible by the oxygen-containing functionalities such as carboxylic, carbonyl and phenolic groups that serve as anchor points of metal nanoparticles. Also, theoretical calculations have shown considerable affinity between metals and pristine graphene and carbon nanotubes. However, very recent experimental reports suggest that metal-carbon interaction is actually covalent in nature.

Graphene-nanoparticle hybrids are commonly prepared by in situ reduction, hydrothermal and electrochemical techniques, and ex-situ methods. One of the challenges of all the in situ techniques is the difficulty to control the size and morphology of the nanoparticle. On the other hand, for ex-situ methods, since the NPs are synthesized beforehand, it allows precise control of the size, shape and density of NP. Of these four, in situ reduction techniques are the most commonly employed method as these are usually one-pot synthetic routes, highly efficient, easily performed and environment-friendly. Though ex situ methods allow for better control of the size distribution of the NP, in situ methods are more explored in literature since the simplicity of the method outweighs the cost, tedious procedure and time-consuming nature of ex situ procedures. The incorporation of these metal nanoparticles on carbon supports usually involves surfactant- or polymer-stabilized nanoparticles which require separate synthetic procedure for the metal nanoparticle. This process is not only tedious but also not environment-friendly since it uses several reagents and solvents in the process of fabricating the material.

It is therefore a problem of the invention to pursue alternatives that are facile, environment-friendly and cost-effective.

SUMMARY OF THE INVENTION

The problems noted above and others are solved by the processes and compositions of the present invention.

In one embodiment a method for photoreducing graphene oxide is provided utilizing UV-generated ketyl radicals.

In a further embodiment of the invention, patterned conductive structures are formed utilizing masks.

In yet another embodiment, the photoreduction can be carried out in solution, solid-state, and even in polymer composites. The processes of the present invention can utilize many different polymer matrixes.

In still another embodiment of the invention, the photoreduction is induced with a photoinitiator that generates ketyl radicals upon exposure to ultraviolet radiation.

In yet a further embodiment a process is disclosed which generates, in situ, metal nanoparticles and reduced graphene oxide simultaneously. In particular, a photoinitiator that serves as a ketyl radical generator that is activated by UV radiation simultaneously reduces the metal nanoparticle precursor and graphene oxide to a metal nanoparticle and graphene.

BRIEF DESCRIPTION OF THE DRAWINGS

The invention will be better understood and other features and advantages will become apparent by reading the detailed description of the invention, taken together with the drawings, wherein.

DETAILED DESCRIPTION OF THE INVENTION

Photoreduction of Graphene Oxide

Figure 1:
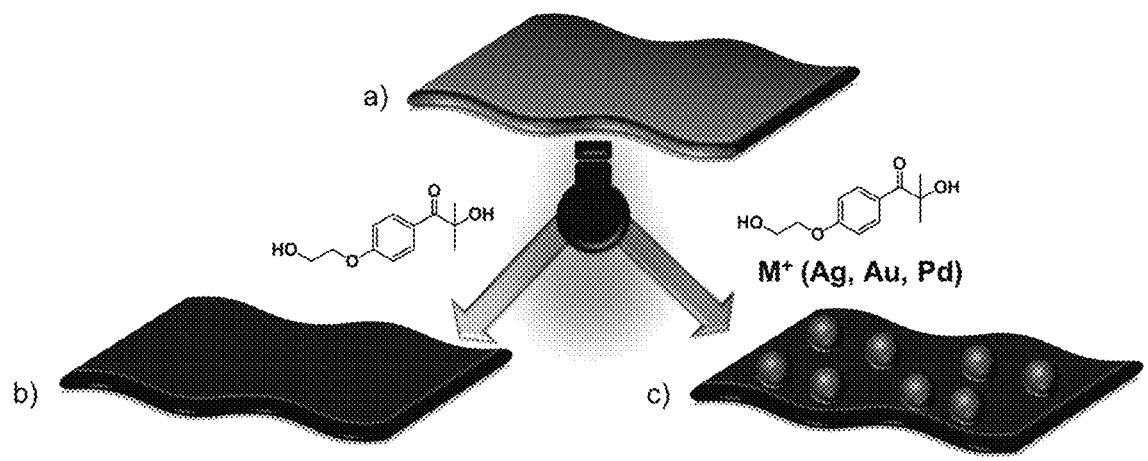
FIG. 1 illustrates the formation of reduced graphene oxide (rGO) (b) and metallic nanoparticle hybrids (c) by photoreduction of GO (a) with ketyl radical generator, I-2959 also known as 2-hydroxy-4'-(2-hydroxyethoxy)-2-methylpropiophenone (HMP)

Methods for photoreduction of graphene oxide are disclosed herein. In a preferred embodiment, photoreduction is performed using a photoinitiator such as 2-hydroxy-4'-(2-hydroxyethoxy)-2-methylpropiophenone (HMP) (also referred to as I-2959 in this document). Advantageously, various patterned conductive structures can be formed utilizing the method.

In order to form graphene-base materials, a photoreducible composition is obtained comprising graphene oxide that serves as a precursor to graphene; a photoinitiator; and any other desired components depending on whether the photoreduction is to be carried out in solution, solid-state or a polymer composite.

Graphene oxide is obtained from a suitable source. In one embodiment, graphene oxide is prepared based upon the report of Tour et al. (J. Am. Chem. Soc., 2012, 134 (5), pp 2815-2822). Graphene oxide includes any oxidized state of graphene and may be derived from other methods as well.

The graphene-forming compositions also include a suitable photoinitiator. A suitable photoinitiator is one which is activated by irradiation with a particular wavelength resulting in various types of radicals or energy pathways as described in a Joblonski diagram. It may also allow reactions which are normally thermally forbidden. General classes of photoinitiator include benzyl ketals, benzoin ethers, dialkoxy acetophenones, hydroxyalkyl phenones, aminoakylphenones, acylphosphine oxides, benzophenones/amines, thioxanthones/amines, and titanocenes. They can be used in stoichiometric or non-stochiometric quantities. In one embodiment a suitable photoinitiator is HMP.

Photo-Irradiation

For photo-irradiation, a desired amount of graphene oxide and photoinitiator are added to a solvent such as tetrahydrofuran (THF) in a suitable vessel. In a typical experiment, a solution of HMP (20 mM) and GO (1 mg/mL) is placed in a glass vial with a stir-bar. This is then photo-irradiated, for example using a Honle Bluepoint 4 Ecocure irradiation set-up with a single light guide. A 320-390 nm filter was used on all irradiation experiments. The distance of the light guide to the film was optimized to 200-500 $mW/cm^2$ power density. After the reaction, the solution was centrifuged to collect the sediment. It was then re-dispersed in THF and centrifuged for 6 cycles in order to purify the product. For graphene metal nanoparticle hybrids, 300 μL of 10 mg/mL GO solution was added to a 3 mL solution of 20 mM HMP and 10 mM metal precursors (e.g. $AgCF_3SO_3$, $HAuCl_4$, $(C_6H_5CN)_2PdCl_2$). These were then irradiated for 10 min using previously described irradiation parameter. The same purification procedure was performed.

A crude method to ascertain a change in the oxidation state of GO is by its solubility. GO, a heavily oxidized derivative of graphene, contains oxygen-rich functional groups (—OH, —COOH, —C—O—C—) which make it highly soluble in water and in a wide array of polar organic solvents. In general, upon reduction, the oxygen-rich functional groups are eliminated from the surface of GO making it insoluble to the original solvent. By visual inspection, the irradiated GO solutions with the photoreducer I-2959 (FIG. 2a) immediately settled to the bottom of the reaction flask. While in the original solution, is it worth noting that the rGO platelets can be dispersed by simply shaking the flask but it only takes about 2-3 min for them to settle again. As a control, the same irradiation experiment was performed with GO alone and it is evident that the GO sheets are still dispersed in the solvent though the color change from light brown to dark signaled that some degree of reduction occurred (FIG. 2b)). It was also observed that the GO sheets in control solutions irradiated for 10-30 minutes also settled, but after significantly longer periods of time (>30 min).

Solid-state photo-irradiation can be performed by casting or dispersing the mixture onto a suitable surface, for example a clean glass slide and thereafter applying UV radiation.

Polymer-graphene nano-composites can be prepared by adding a polymer to the solution containing the graphene oxide and photoinitiator. General any polymer that can be dispersed in a solvent compatible with the photoinitiator and graphene oxide can be utilized. Suitable polymers include, but are not limited to, polystyrene, thermoplastic polyurethane, poly[oligo(ethylene glycol) methyl methacrylate] (PEGMEMA) and cellulose nanomaterials. For example, a polymer composite solution can be prepared by mixing equal volumes of 50 mg/mL polystyrene (250 kDa), 0.5 mg/ML GO and 20 mM HMP, in one embodiment.

Figure 4:
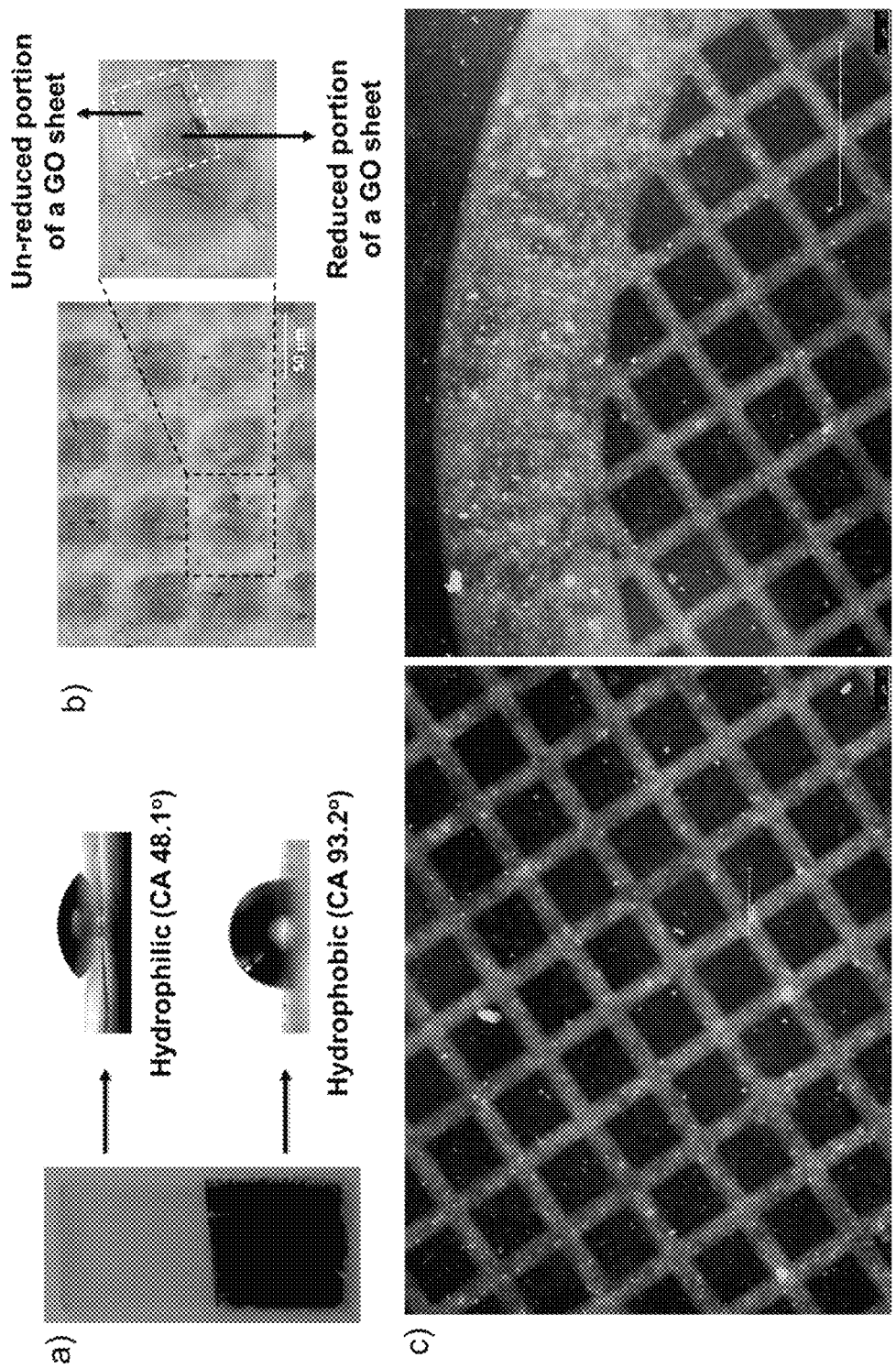
FIG. 4 illustrates photo-patterning of GO. (a) Water contact angle of exposed and non-exposed (covered with aluminum foil) region of GO+I-2959 film. (b) Optical (scale bar: 50 μm) and fluorescence quenching microscopy (scale bar: 75 μm) images of photo-patterned GO+I-2959 film.

The reduction of GO to rGO (reduced GO) was visually evident due to the obvious darkening of the solution or the dropcast film (FIG. 4). The darkening suggests the restoration of the conjugation of graphene. In the photo-irradiated solution, rGO was observed to coagulate because as it gets reduced, the oxygen-rich functionality like alcohols and carboxylic acids are ejected out of graphene which significantly makes it insoluble in solution. Secondly, the restored conjugation promotes partial π-π stacking which also helps in coagulation. After photoreduction, the hydrophilic GO was converted to hydrophobic rGO as evidenced by water contact angle measurements (FIG. 4). The observed hydrophobicity suggests that the functional groups capable of hydrogen bonding or are attracted to water are being ejected out from the surface during the reduction process.

Figure 2:
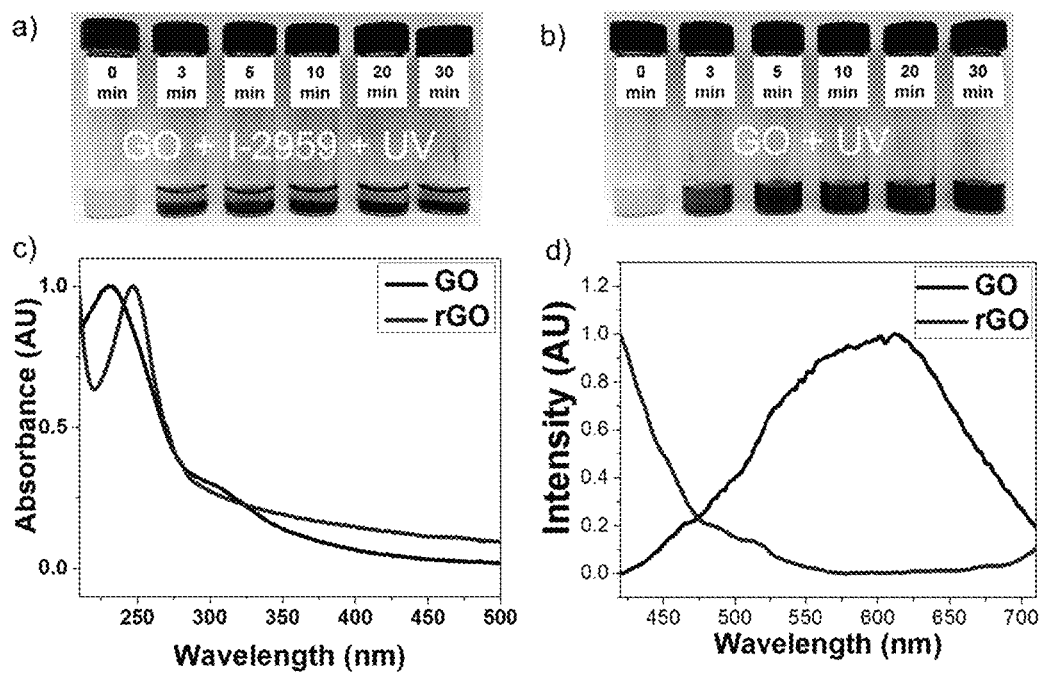
FIG. 2 illustrates the photographs of GO solutions irradiated with (a) and without (b) I-2959 at different time intervals. UV-Vis spectra of c) GO and d) GO with I-2959 after irradiation.

Detailed investigation and characterization of the photoreduction was performed mainly by spectroscopic techniques. The UV-Vis spectrum of native GO is characterized by two signature peaks at 231 nm and shoulder peak at 300 nm corresponding to —C=C— and —C=O transitions, respectively. FIG. 2c clearly shows that the signature peaks of GO disappeared and that the spectrum is red-shifted with a maxima at 247 nm. The attenuation of the shoulder band of GO which is due to the C=O (n-π) absorption also suggests removal of the carbonyl moieties of GO. This is further exemplified by XPS (FIG. 3b) which clearly indicates significant decrease in the binding energies corresponding to C—O and C=O functionalities and accompanied by significant increase in the C—C region. We also employed X-ray scattering analysis (FIGS. 3c and 3d) which show the 002 peak of GO that disappeared after photoreduction, clearly suggesting the conversion of GO to rGO. Another simple method to ascertain the successful reduction of GO is to monitor its fluorescence. GO is actually fluorescent at $\lambda_{excitation}$=400 nm with an emission band centered at ~600 nm. The functionalized groups C—O, C+=O and O+=C—OH attached to the sp² carbons of GO are all related to the emission and a detailed discussion on the origin of its fluorescence is discussed elsewhere. Hence, the removal of these functional groups would result to the loss of fluorescence and can be used to monitor reduction. FIG. 2d demonstrates this effect, where after photoreduction, the fluorescence of GO centered at ~600 nm diminished.

Figure 3:
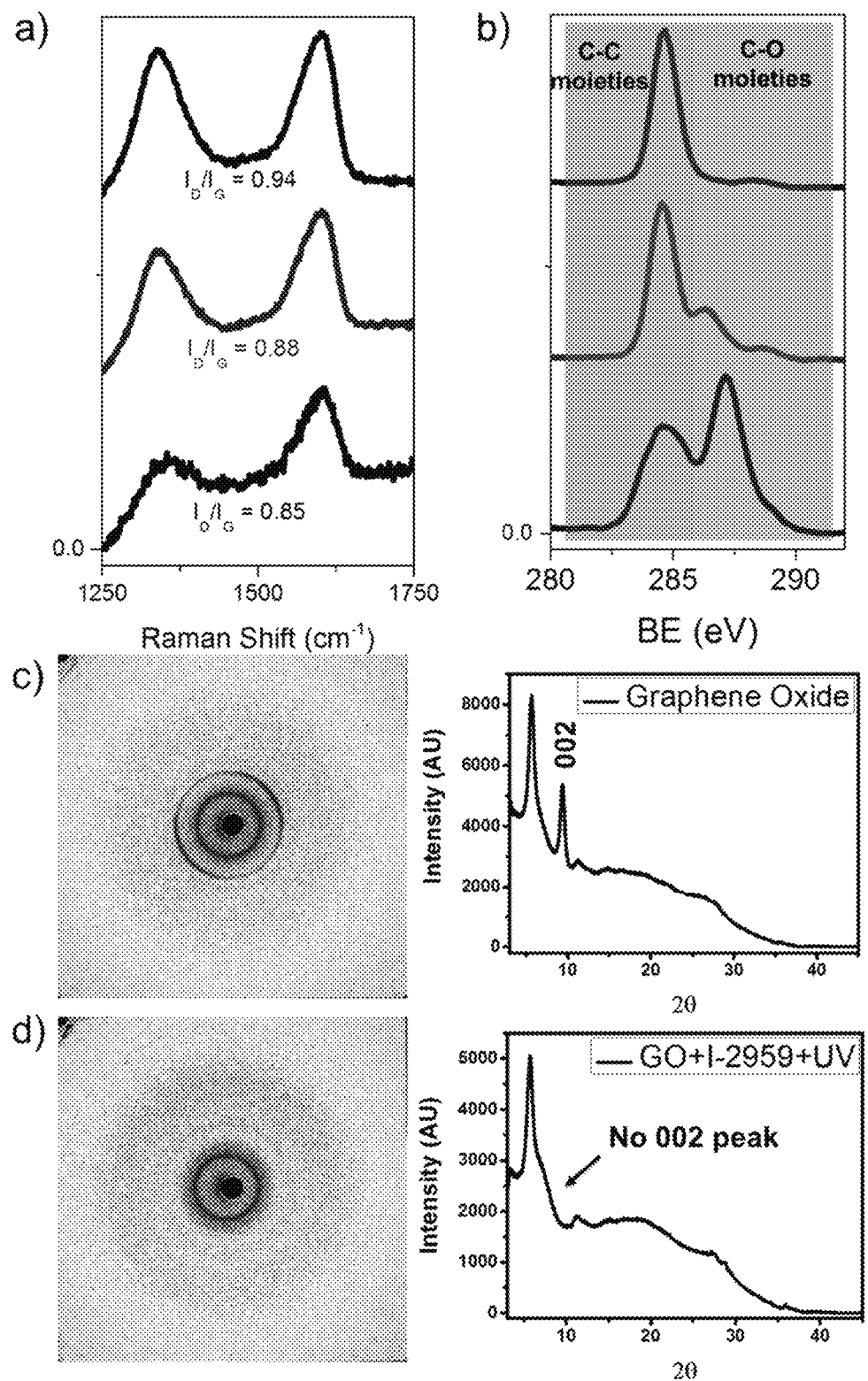
FIG. 3 illustrates (a) Raman and (b) XPS spectra of GO (black line), GO+UV (red line) and GO+I-2959+UV (blue line). (c) WAXS of GO and (d) GO+I-2959+UV.

Raman spectroscopy provides a more compelling evidence on the photoreduction. This technique is indispensable in the study of graphene-based materials' electronic and structural properties. The Raman spectrum of a GO sample is typically characterized by a G-band arising from the $E_{2g}$ phonon of sp² carbons (graphite lattice) and a D-band (disorder band) arising from the breathing mode of κ-point photons of $A_{1g}$ symmetry. The D-band results from structural imperfections created by the functional groups on the surface of graphene and the density of edges created during chemical treatment. In reduction studies, the ratio of the intensity of D and G bands is generally proportional to the average population of sp² domains. FIG. 3a presents the Raman spectra of GO, GO+UV and GO+I-2959+UV. Without a photoreducer, the D/G value increased a little bit from 0.85 to 0.88. A dramatic increase in D/G value of GO+I-2959+UV from 0.85 to 0.94 indicates that the system with I-2959 performs better in reducing GO. The increase in D/G ratio after reduction is commonly observed in the reduction studies of GO. There are two schools of thought in explaining this phenomenon—the increase in graphitic domains and the increase in the density of edges. During reduction, large quantities of small graphitic domains are formed compared to the original GO. As a result, although there are more defect-free sp² carbons, the population of small graphitic domains in reduced GO effectively contributes larger quantities of structural defects, leading to the increase in the D band. In the same manner, with the creation of small graphitic domains, comes the creation of many edges. The increase in the population density of edges also increases the level of disorder, hence, the increase in D band.

Figure 9:
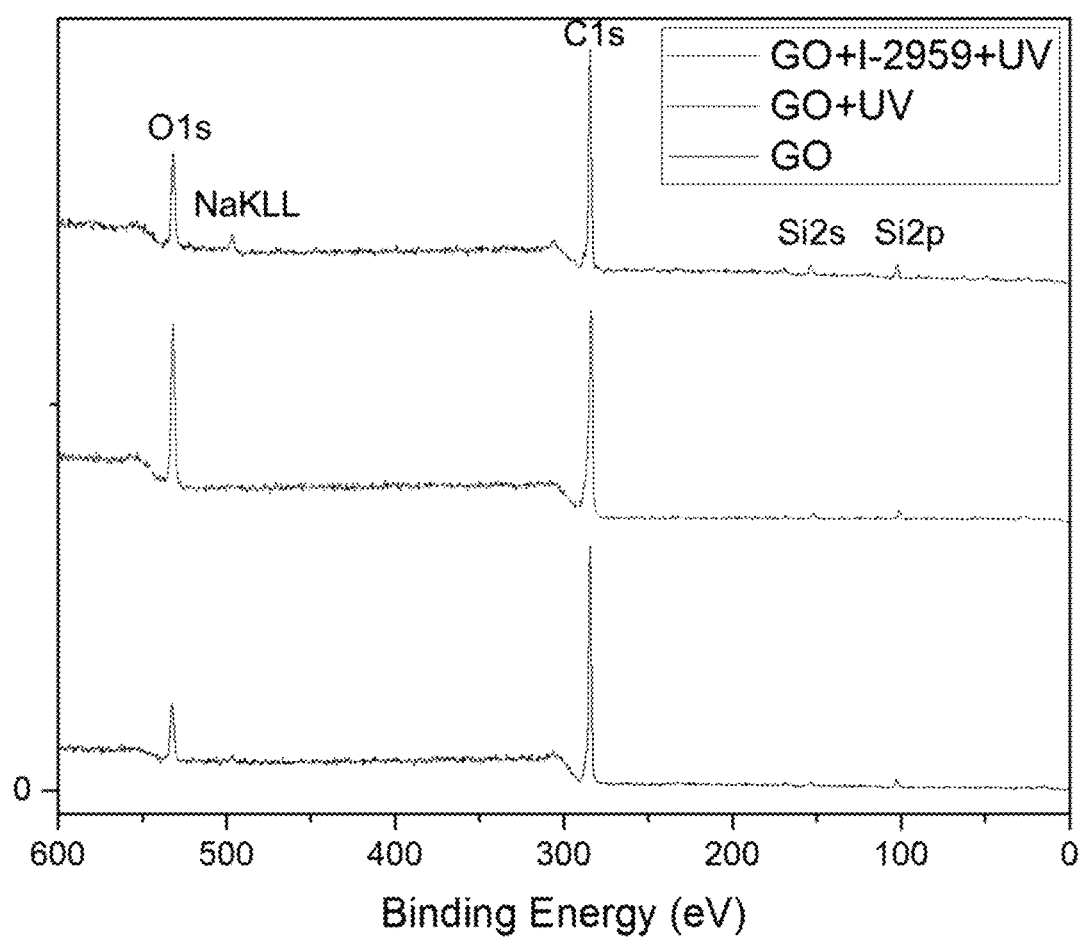
FIG. 9 illustrates a XPS survey scan of GO, GO+UV and GO+I-2959+UV.

To better understand the chemistry of photoreduction, we surveyed the elemental composition of the products by X-ray Photoelectron Spectroscopy (XPS). FIG. 9 displays the survey scans showing signals for the binding energies for C1s (284.6 eV) and O1s (532.8 eV). Minimal peaks for Si2p and NaKLL from the glass substrate were also observed. The absence of binding energies from Manganese and Sulfur suggests that the as-synthesized GO is pure and devoid of excess oxidants. However, the most interesting result in the XPS studies can be obtained from the high-resolution scans at the spectral window of Carbon (FIG. 3B). The C1s spectrum of graphene sample can be simply categorized into two, the C—C (from ~282-286 eV) and C—O (from ~286-290 eV) containing regions. The C1s spectra were deconvoluted to four components namely C—C (284.6 eV), C—O (286.7 eV), C=O (288/0 eV) and O=C—OH (288.9 eV). From the deconvoluted data the C/O ratio of GO, GO+UV, GO+I-2959+UV were calculated to be 2.6, 5.0 and 25.6, respectively. The significant lowering in the C—O containing region in GO+I-2959+UV as well as the high C/O ratio suggests that indeed, the GO was reduced and that I-2959 is excellent at removing oxygen-containing moieties.

In addition, X-ray Diffraction (XRD) studies by Wide Angle X-ray Scattering (WAXS) scattering show the signature diffraction pattern of GO at 2θ=9.38° corresponding to a d-spacing of 9.42 Å (FIG. 3c). This is consistent with the usual ~1 nm thickness of a GO sheet as measured by AFM. The XRD data also suggested that the as-synthesized GO is free from unreacted graphite due to the absence of the 2θ=26.52° peak which corresponds to graphite layered structure. After photoreduction, the signature diffraction peak of GO completely disappeared confirming the conversion of GO to rGO. Static water contact angle (CA) measurement was also performed as this could demonstrate the presence, absence, increase or decrease of the functionalities present in the graphene sample. This was done by spin-coating a solution containing GO and I-2959 followed by photo-irradiation. FIG. 4 shows a photograph of a glass slide which was spin-coated with the solution. The upper part was covered with aluminum foil and the lower part was exposed to UV light. As displayed in the figure, it is apparent that shortly after 3 min irradiation, the exposed area dramatically changed from pale yellow to dark, signaling reduction. The covered region is classified as hydrophilic with CA of 48.1° while the exposed region immediately turned hydrophobic with a CA of 93.2°. The observed hydrophobicity suggests that the functional groups capable of hydrogen bonding or are attracted to water are being ejected out from the surface during the reduction process.

Applications

In view of the above, various photoreduced graphene compositions are produced. One promising application results in polymer-graphene nanocomposites. Various electrodes can be photo-fabricated in the micro or nano-regime. Photoreduction is beneficial because one can afford individual conducting and non-conducting regions by simply using a photo-mask. To demonstrate the potential of this photochemistry in the fabrication of micro-electrodes, simple photopatterning on GO+I-2959 composite film using a TEM copper grid as a photomask was performed. To demonstrate selective reduction, a TEM grid photomask was adhered to the film surface before irradiation. The formation of well-defined reduced regions is shown in FIG. 4b. FIG. 4b demonstrates the effectiveness of this approach, where the dark area corresponds to the exposed regions of the film. The single GO sheet of about 50 μm (enlarged) that happened to be in the border of the grid's hole and line clearly shows that the region of the sheet that was exposed to light was reduced while the other was not. Selective reduction was also observed in the polymer composite film.

Several studies have also shown that graphene effectively quenches fluorescence of a wide array of aromatic of dyes by energy transfer mechanism between the fluorophore and graphene. We employed this concept to further probe the successful photoreduction of GO by I-2959 i.e. if the π-conjugated structure of GO was restored during photoreduction, a quenching mechanism should be observed. We performed the experiment according to reported literature by simply spin-coating a thin layer of fluorescein in poly(methyl methacrylate) PMMA matrix on top of previously photo-patterned GO+I-2959 film. FIG. 4c displays the fluorescence quenching microscopy (FQM) image where the dark areas represent photoreduced GO which efficiently quenched the fluorescence of the thin layer of dye on top. On the other hand, the bright areas of the FQM image are the non-reduced portion of the film, confirming that through this proposed photoreduction technique, the formation of conducting and insulating domains can be readily achieved demonstrating its promise for microelectronics fabrication.

Figure 10:
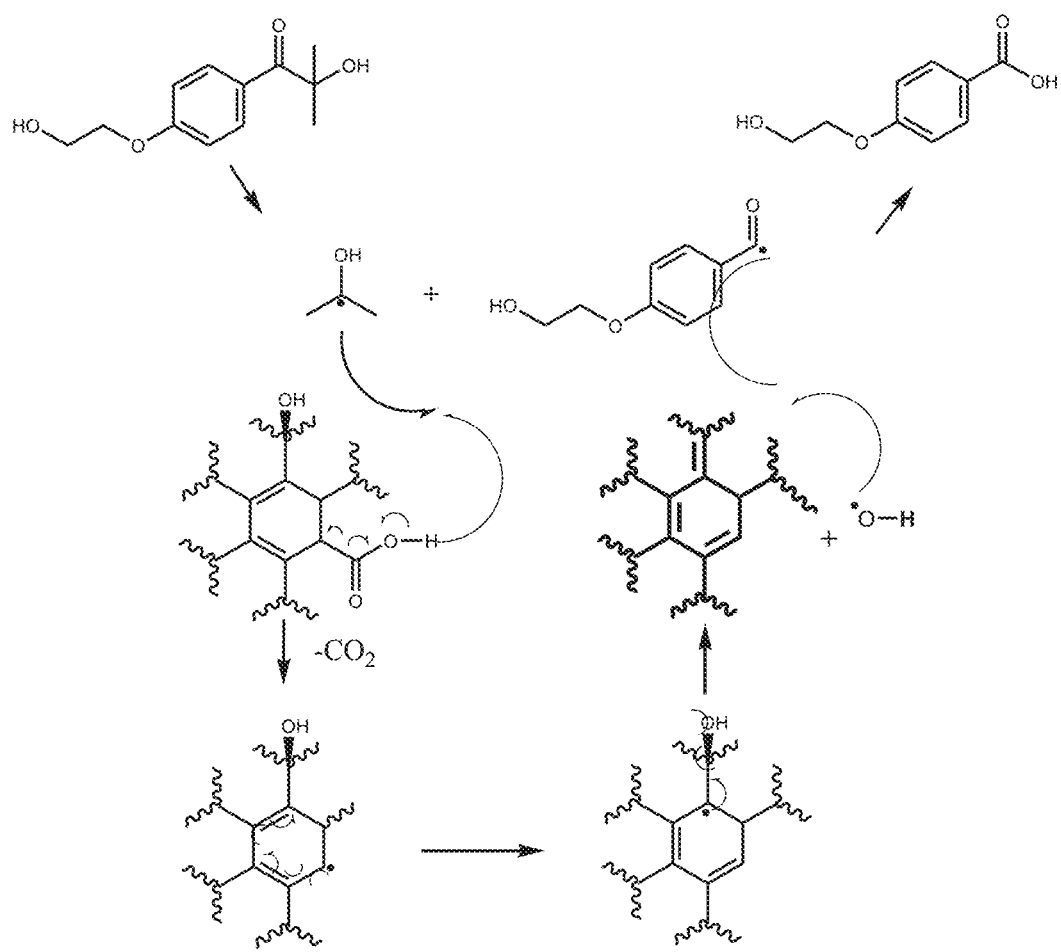
FIG. 10 illustrates a proposed mechanism of the photo-reduction of GO using I-2959.

The results of the spectroscopic and imaging experiments shed light on the underlying mechanism of the photoreduction. In particular, the fluorescence quenching ability of the photoreduced GO suggests the restoration of the aromatic regions; and this is also supported by the hydrophobic effect which means that the functional groups on the surface are being removed during the reduction process. This is further supported by the Raman data suggesting that plenty of graphitic domains are being formed during the process. Meanwhile, the XPS data show significant removal of —OH and —COOH moieties after reduction. Taken together, we propose FIG. 10 as one of the potential mechanisms involved during the photoreduction. Since the functional groups in GO are randomly distributed, there could not be a single mechanism to explain the reaction. Instead, a model GO can be utilized to gain mechanistic insights as to why the reaction occurs. There is a wealth of experimental evidence that the photoreduction of GO in the absence of a reducer proceeds mainly by the removal of OH groups followed by the elimination of CO and $CO_2$ which are more difficult to remove as it requires higher energy. As a consequence, most of the photoreduced GO are still dispersable in solution due to the alcohols and carboxylic acid moieties that are still present. This is also observed in our experiments where after exposure with UV, the set-up without the photoreducer tends to remain in solution longer (FIG. 2b). In effect, these photoreduced GO do not exhibit appreciable conductivity. A detailed discussion on the mechanism of GO reduction can be found elsewhere On the other hand, the photo-dissociation of I-2959, a Norrish type 1 cleavage is a well-established chemistry. During irradiation, the α-C—C bond is cleaved forming ketyl (blue) radicals and benzoyl (red) radicals. Ketyl radicals are known to be strong reducing agents. They can be viewed as "caged electrons" ready to react with appropriate electron and proton acceptors such as a metal ions. On the other hand, the benzoyl radical readily oxidizes to benzoic acid in air or in the presence of water. Hence, we propose the mechanism depicted in FIG. 10, where a ketyl radical abstracts the proton from carboxylic acid leading to the removal of —COOH and formation of $CO_2$. As the reaction proceeds, the OH groups can be easily liberated because this reaction is further pushed forward as it can couple with benzoyl radicals to form the benzoic acid. The removal of —OH groups is also favored because it results to a more stable conjugated structure. As a result, with the elimination of —COOH and —OH groups, the conjugation of GO is restored, effectively reducing it.

In view of the above, novel photoreduction methods of graphene oxide to photoreduced graphene based on the generation of ketyl radicals have been demonstrated. Photoreduction is versatile and it can be carried out in solution, solid-state and even polymer composites. Fabrication of various devices can be undertaken comprising polymer-graphene nanocomposites.

Grafting of Metal Nanoparticles on Graphene via Photoreduction

In view of the above processes, it is disclosed herein that metal nanoparticles can be generated in situ during the reduction of graphene oxide to graphene, resulting in metal nanoparticles grafted to the graphene. It has been found that the ketyl radical generator or photoinitiator utilized in the method, when activated by UV irradiation, simultaneously reduces metal nanoparticle precursors and graphene oxide. The reduced graphene oxide serves as the stabilizer and anchor for growth of the metal nanoparticles. A reaction scheme is illustrated in FIG. 1.

Various metal precursors can be utilized in order to form nanoparticles. In order for the nanoparticles to have a high degree of monodispersity, it is crucial for the metal precursor and other components to be soluble or well-dispersed in the graphene-forming composition or solution. Examples of suitable metal precursors include, but are not limited to, Ag, Au and Pd. For this experiment, we demonstrate that Ag, Au and Pd nanoparticles can be easily grafted on the surface of GO by simply irradiating a mixture of GO (1 mg/mL), I-2959 (20 mM) and metal precursors $AgCF_3SO_3$, $HAuCl_4$ and $(C_6H_5CN)_2PdCl_2$ (10 mM) for only 10 minutes and without any other surfactant.

The reaction conditions described above can be utilized. As an example, nanoparticle grafted graphene was produced by photoreduction as follows.

Figure 8:
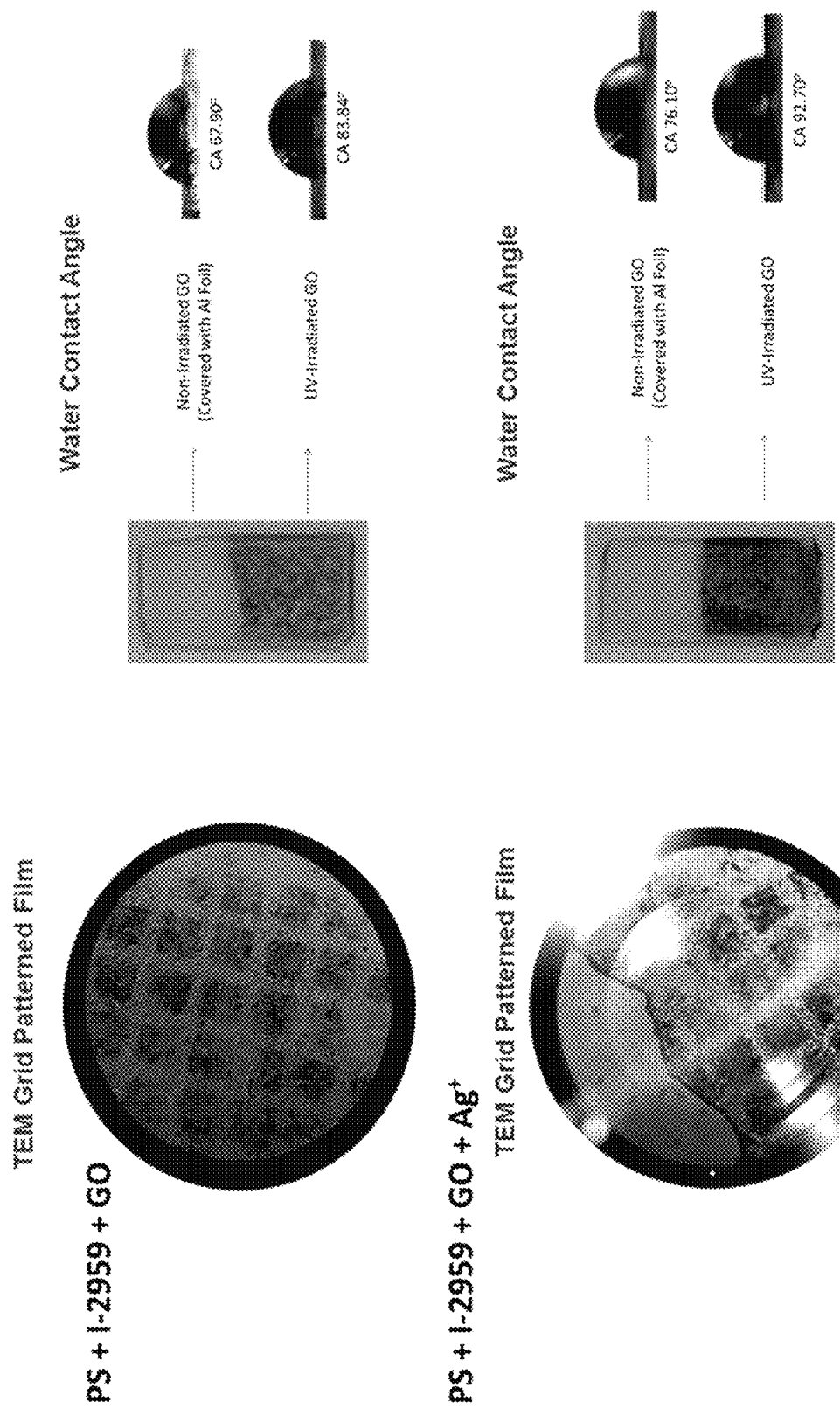
FIG. 8 illustrates the water contact angle and photo-patterned polystyrene nanocomposite films with and without silver precursor.

We also photo-patterned a polystyrene composite film containing graphene oxide, silver precursor and HMP (FIG. 8).

Figure 5:
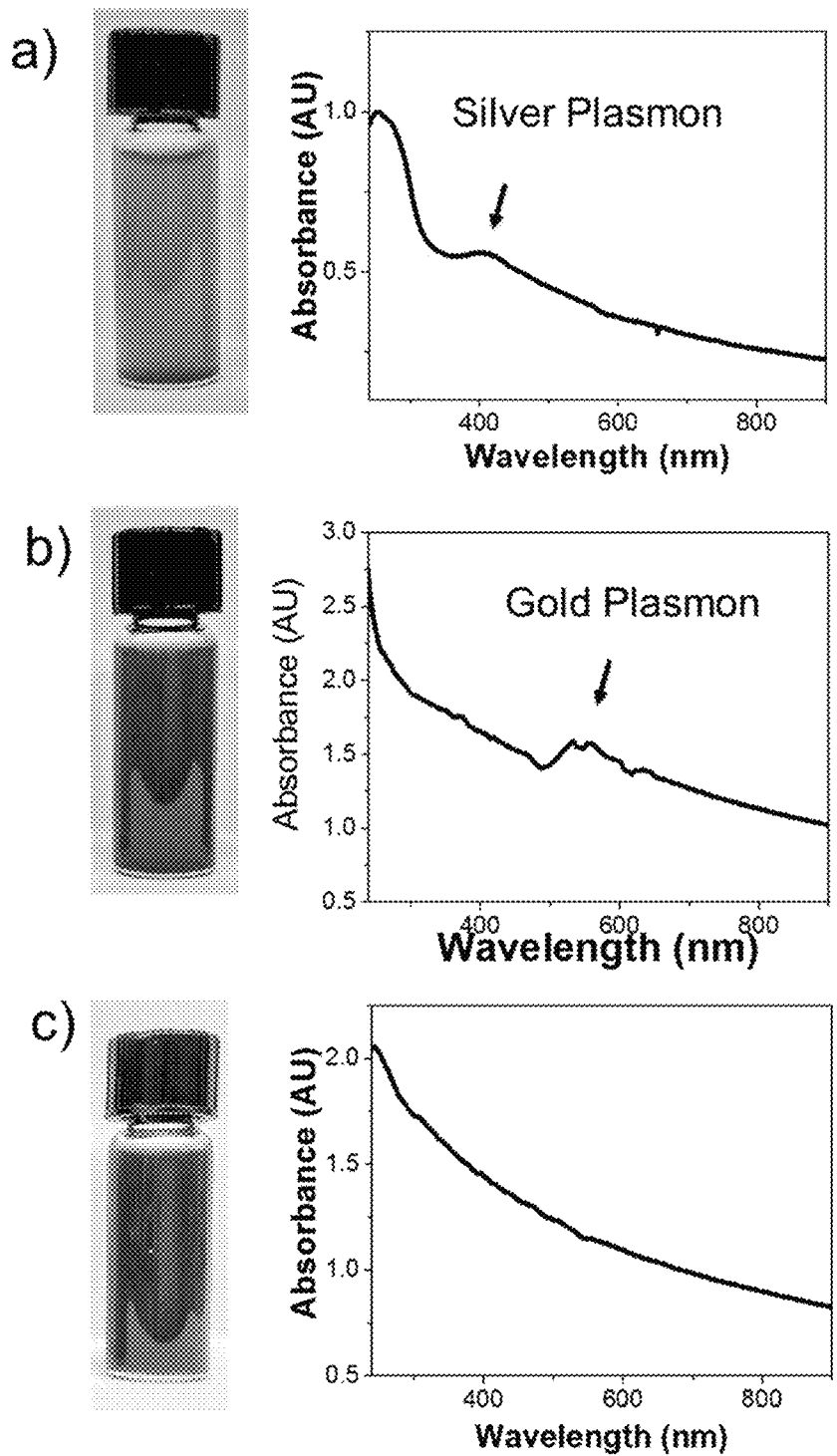
FIG. 5 illustrates the photograph and UV-Vis spectra of 0.5 mg/mL solution of (a) rGO-AgNP, (b) rGO-AuNP and (c) rGO-PdNP in MeOH.

The photoreduction was monitored by several spectroscopic techniques, including UV-Vis, fluorescence, XPS (FIG. 6), IR and Raman. FIG. 5 shows the yellow rGO-AgNP solution with a surface plasmon resonance (SPR)

band centered at ~400 nm, indicating the formation of AgNP on rGO. On the other hand, the typical red color or AuNP solution is also evident on the synthesized rGO-AuNP hybrids with SPR band centered at ~560 nm (FIG. 5B). The characteristic dark color of PdNP in solution with no distinct absorption band at 300-900 nm is also evident in rGO-PdNP (FIG. 5C). We carried out the same experiment without graphene oxide and we observed that silver nanoparticles were not produced. This suggests that graphene oxide is necessary for the formation of silver nanoparticle wherein it serves as a stabilizing agent and anchorage for the nanoparticle growth.

The $I_D/I_G$ ratio of the Raman spectrum (FIG. 6) for rGO-AgNP, rGO-AuNP and rGO-PdNP are 0.86, 0.83 and 0.85, respectively. Compared to unmodified GO, these values suggest that a significant amount of oxygen-containing functionalities are retained during the reaction as they serve as anchor points and stabilizers of the metal nanoparticle. This is also evidenced by a slightly attenuated C—O region in C1s spectra of the samples, suggesting minimal reduction of GO. These functional groups also aid the easy dispersion of these materials in solution. More interestingly, a Surface-Enhanced Raman Scattering (SERS) effect in the D and G bands was observed especially for rGO-AuNP and rGO-AgNP which also indicates the successful decoration with metal nanoparticles. In particular, AuNP and AgNP are widely used as components for SERS, a highly sensitive molecular spectroscopic method based on the enhanced optical field generated on the surface of NPs due to their localized SPR resulting to the enhancement of Raman scattering of molecules on or near the surface of NP. SERS is enormously useful in biomedical diagnosis, therapy, reaction monitoring, environmental protection and food analysis.

Figure 6:
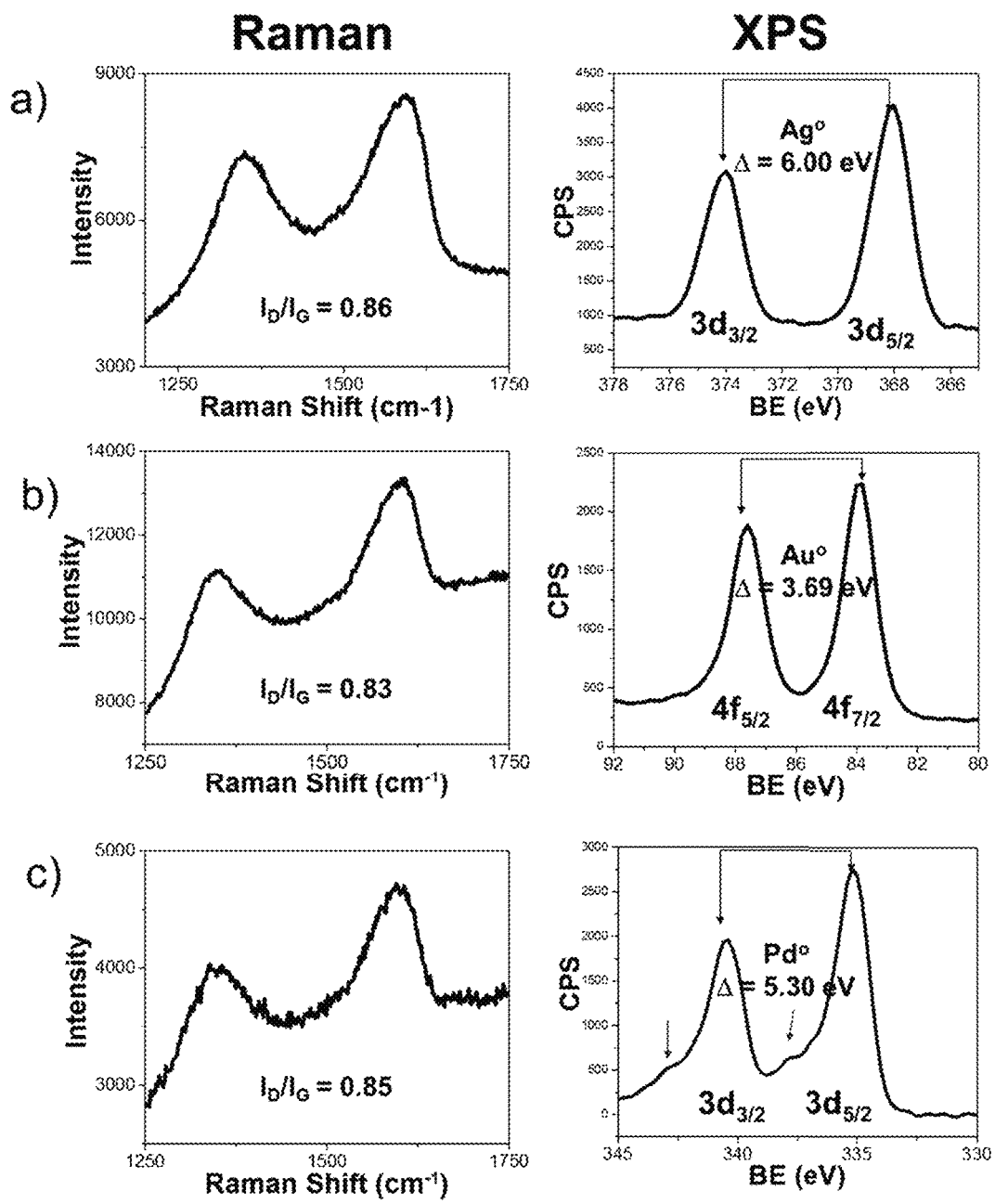
FIG. 6 illustrates the (a) Raman and high-resolution XPS spectra of (a) rGO-AgNP, (b) rGO-AuNP and (c) rGO-PdNP.

Another important aspect in nanoparticle synthesis is to probe the oxidation state of the formed metal nanoparticle. With an oxygen-rich GO in a less controlled reaction such as described herein, the formation of metal oxides comes into question. This is important because oxides of metallic nanoparticles exhibit different optical and catalytic performance compared to their metal counterpart. By XPS, the values of binding energies as well as the spin-orbit separation ($\Delta$) are two useful parameters in interrogating the nature of the metallic nanoparticle (FIG. 6). The Ag $3d_{3/2}$ (374.3 eV) and Ag $3d_{5/2}$ (368.3 eV), Au $4f_{7/2}$ (84.0 eV) and Au $4f_{5/2}$ (87.7 eV), and Pd $3d_{3/2}$ (340.5 eV) and Pd $3d_{5/2}$ (335.2 eV) values are all consistent to the reported binding energies of their metallic form (with a zero oxidation state). This is also reflected in the $\Delta$ values which are congruent to the standard. In the case of GO-PdNP, there is a trace of $Pd^{2+}$ with $3d_{5/2}$ and $3d_{3/2}$ peaks observed at 337.8 eV and 343.5 eV, respectively, which may be due to unremoved metal salt during purification. These results further solidify the potential of this process in fabricating metallic nanoparticles supported on GO for only a matter of minutes with little to no formation of metallic oxides.

Figure 7:
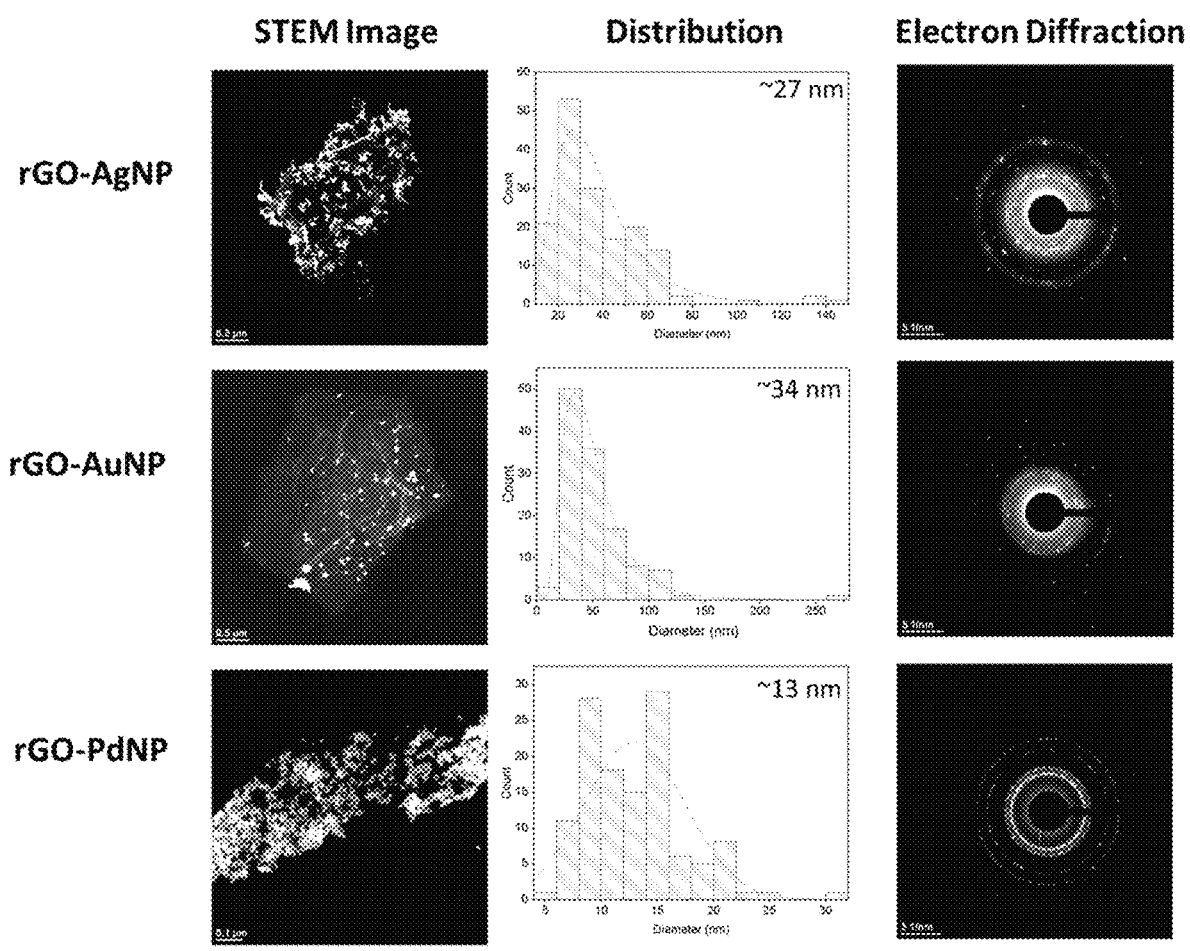
FIG. 7 illustrates STEM image, particle distribution, and electron diffraction patterns of (a) rGO-AgNP, (b) rGO-AuNP and (c) rGO-PdNP.

Transmission electron microscopy (TEM) studies were conducted in order to visualize the formation of metallic nanoparticles. Transmission electron microscopy (TEM) images and electron diffraction data further evidenced the formation of fairly monodispersed nanoparticle (FIG. 7) with sizes mostly ranging from ~10-30 nm. Standard bright-field TEM and scanning transmission electron microscopy (STEM) were performed to ascertain the particle size distribution of the produced nanoparticles. The particle size distribution or histogram was obtained by measuring at least 100 nanoparticles. FIG. 7a-c shows the STEM images of AgNP, AuNP and PdNP sitting on the surface of rGO with particle size distribution centered at 27 nm, 34 nm and 13 nm. For all photoreduction synthesis, the molar amounts of the photoreducer as well as the metal precursor, regardless of their valency, were made equal. Hence, it is not worthwhile to fundamentally rationalize the difference in size of the produced metal nanoparticles this time. However, as previously noted, the difference in size may be accounted from the stoichiometric ratios of photoreducer and metal precursor as well as the different kinetics and redox potentials of Ag, Au and Pd.

It is very interesting to see the formation of individual particles stabilized on the surface of rGO without the addition of any form of surfactant. More importantly, we did not observe any stray nanoparticles or nanoparticles that are not on the surface of rGO. This suggests that the GO sheets are crucial to the nucleation and growth of the nanoparticle. According to Yin et al., the mechanism of attachment of the nanoparticle growth on the surface of GO is similar to conventional nanoparticle synthesis methods which involve the following steps: (1) reduction, (2) nucleation and (3) nanoparticle growth. As earlier mentioned, the functionalities on the surface of GO such as alcohols and carboxylic acids are responsible for the attachment of free metal ions by electrostatic interaction. Therefore, one can also control the population or density of these functional groups as a way to tune the density of nanoparticles formed on the surface of the graphene sample.

Figure 11:
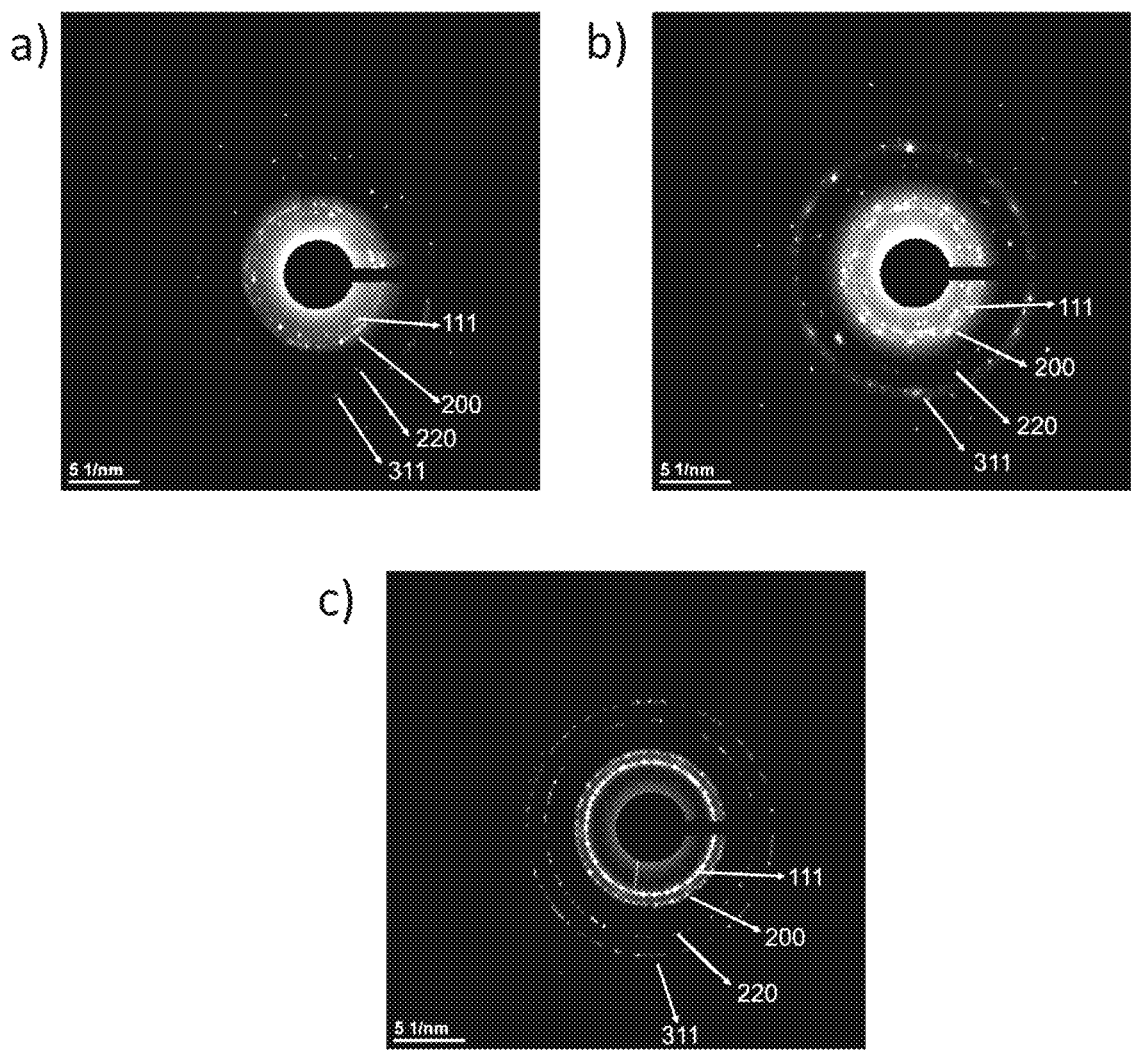
FIG. 11 illustrates a selected area electron diffraction (SAED) pattern of (a) rGO-AuNP, (b) rGO-AgNP and (c) rGO-PdNP.
Figure 12:
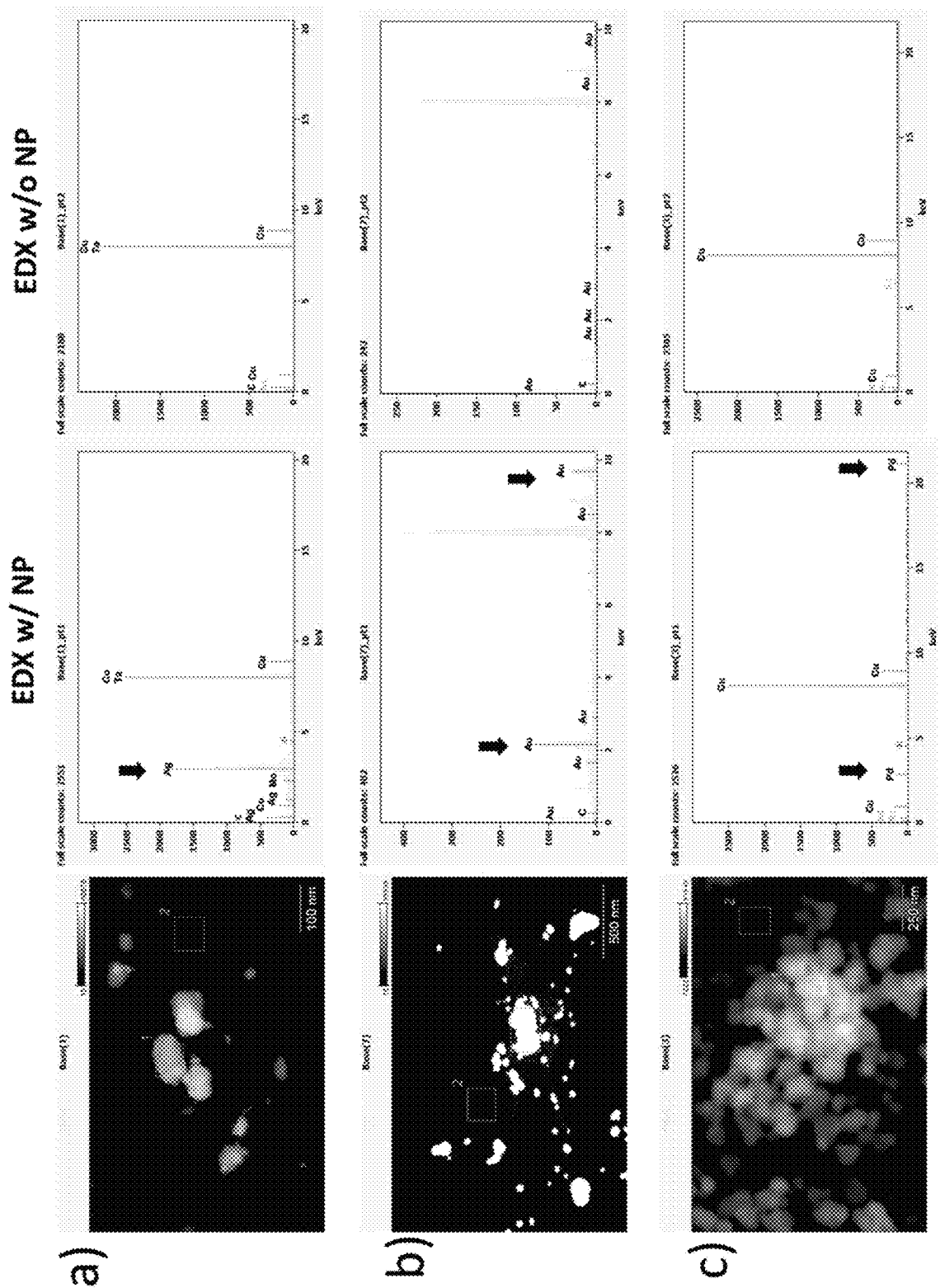
FIG. 12 illustrates STEM images and EDX spectra of (a) rGO-AgNP, (b) rGO-AuNP and (c) rGO-PdNP recorded across the selected areas (yellow—pt 1 and blue—pt 2 boxes). Arrows indicate signature peaks of corresponding metal.
Figure 13:
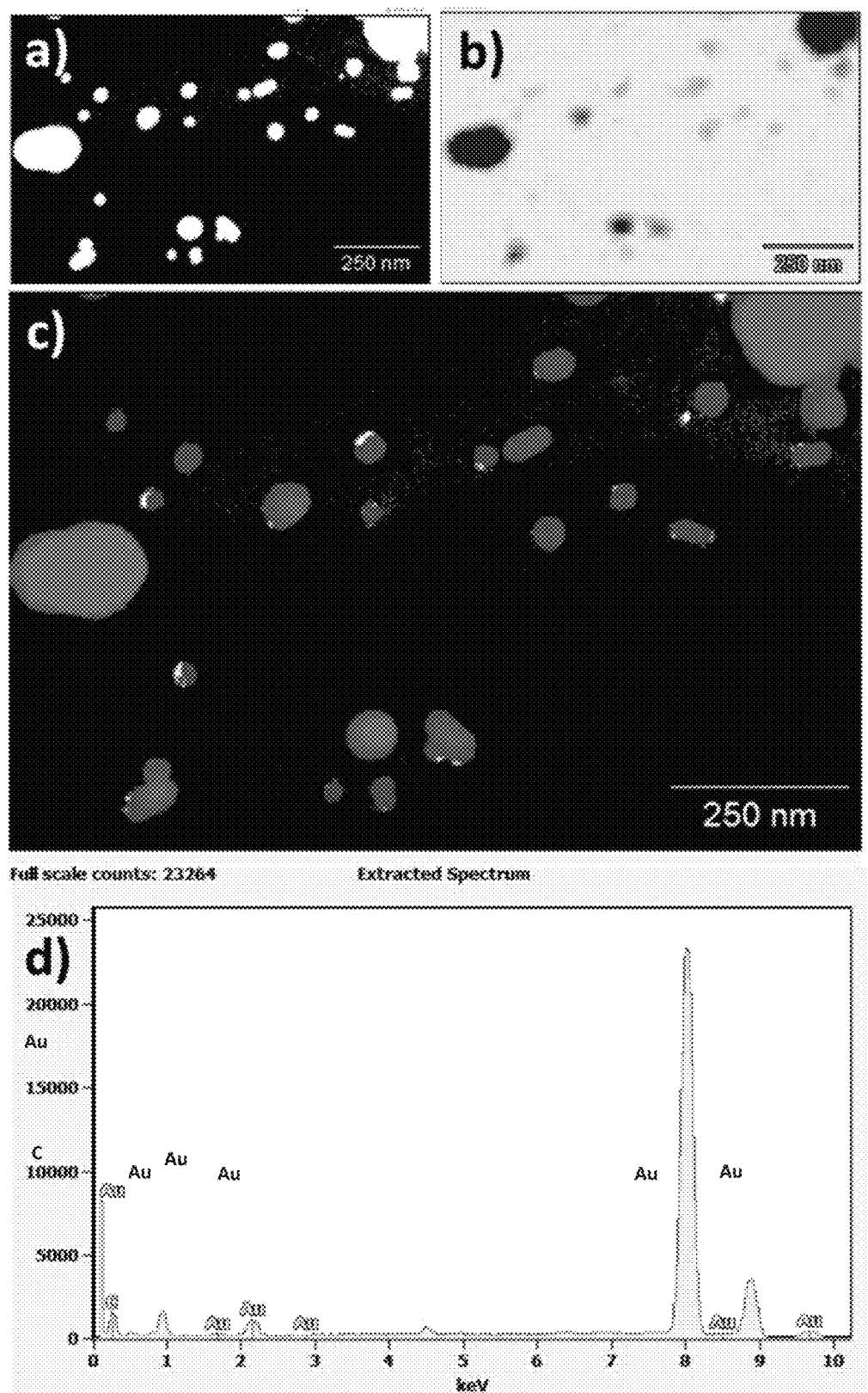
FIG. 13 illustrates TEM-EDX mapping of rGO-AuNP. (a) Original STEM image; (b) Au Lα line map; (c) image overlay and (d) overall EDX spectrum.

Selected Area Electron Diffraction (SAED) experiments were also performed in order determine as to whether the synthesized metallic nanoparticles are crystalline or amorphous. FIG. 11 shows the SAED patterns of rGO-AuNP, rGO-AgNP and rGO-PdNP. All three samples exhibited defined concentric electron diffraction rings which further confirmed that these are polycrystalline metallic nanoparticles. The rings were indexed as (111), (200), (220) and (311) Bragg reflections corresponding to face-centered cubic structure. To complement the XPS data, we also performed Energy Dispersive X-ray Spectroscopy (EDX) under TEM. For each sample, two regions were selected to contrast the area with and without the metallic nanoparticle. For rGO-AgNP, the EDX spectrum across the nanoparticle shows a peak at ~2.96 keV which corresponds to the $L\alpha$ line of Ag (FIG. 12a). Secondly, the EDX spectrum of rGO-AuNP shows the ~9.71 keV and ~2.12 keV peaks which correspond to the $L\alpha$ and M lines of Au (FIG. 12b). Thirdly, the EDX spectrum of rGO-PdNP shows the ~2.84 keV and ~22.17 keV peaks which correspond to the $K\alpha$ and $L\alpha$ lines of Pd (FIG. 12c). As expected, for all three samples, the EDX spectra of the selected area of graphene without nanoparticles only show primarily the energy lines corresponding to C (from rGO) and Cu (from TEM grid). The information obtained from EDX analysis further substantiates the successful grafting of metallic nanoparticles on the surface of rGO. The result also shows that TEM-EDX may be used to analyze and characterize these nanoparticle hybrids. To further extend this analysis, we attempted to perform EDX mapping on rGO-AuNP. FIG. 13 shows that EDX mapping is indeed a powerful tool to visualize the elemental composition and distribution of metallic nanoparticle throughout the sample.

Figure 14:
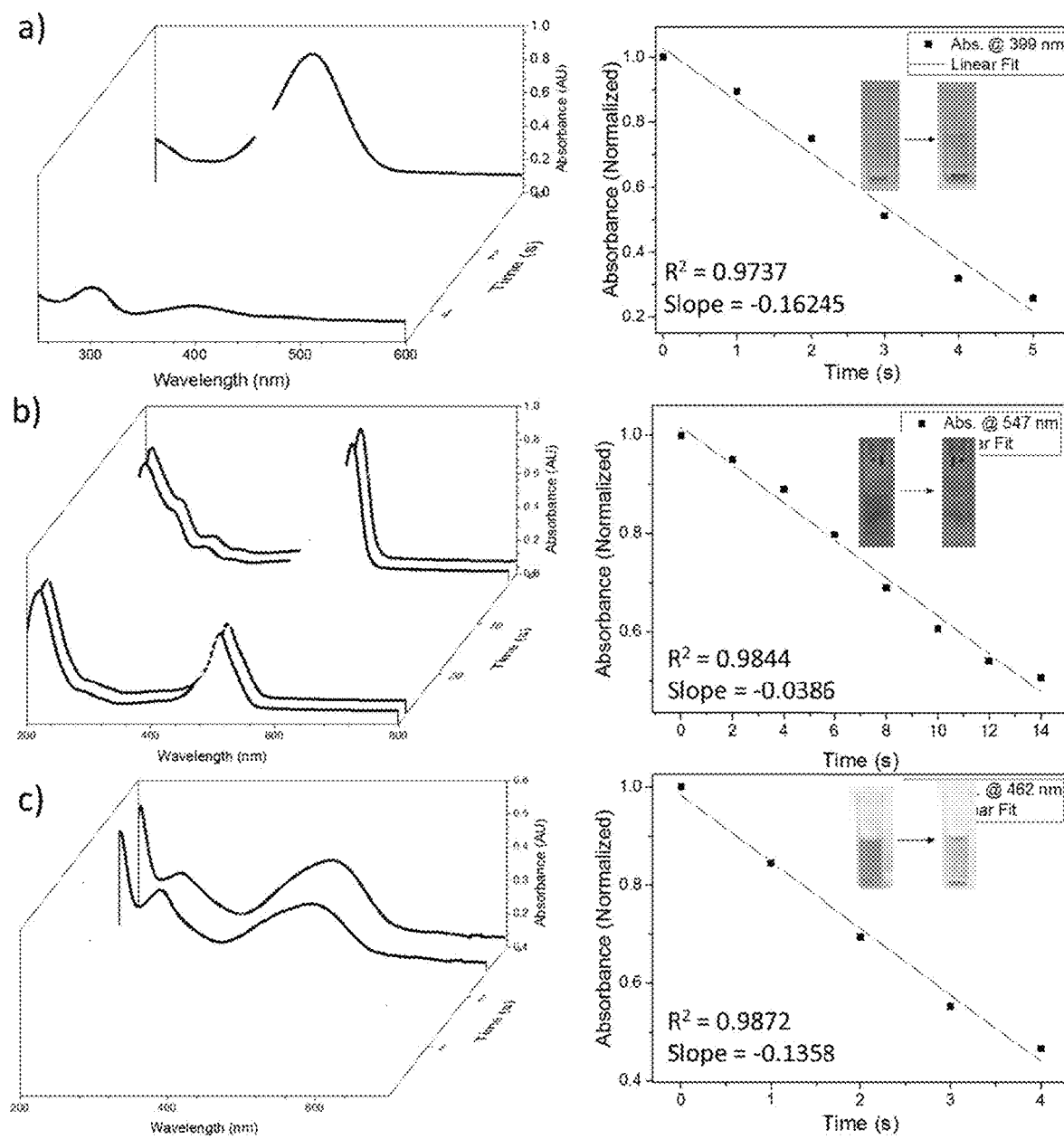
FIG. 14 illustrates catalytic performance of rGO-AgNP on the degradation of (a) 4-Nitrophenol, (b) Rose Bengal and (c) Methyl Orange as monitored by UV-Vis spectroscopy. Insets are photographs before and after the addition of rGO-AgNP.
Figure 15:
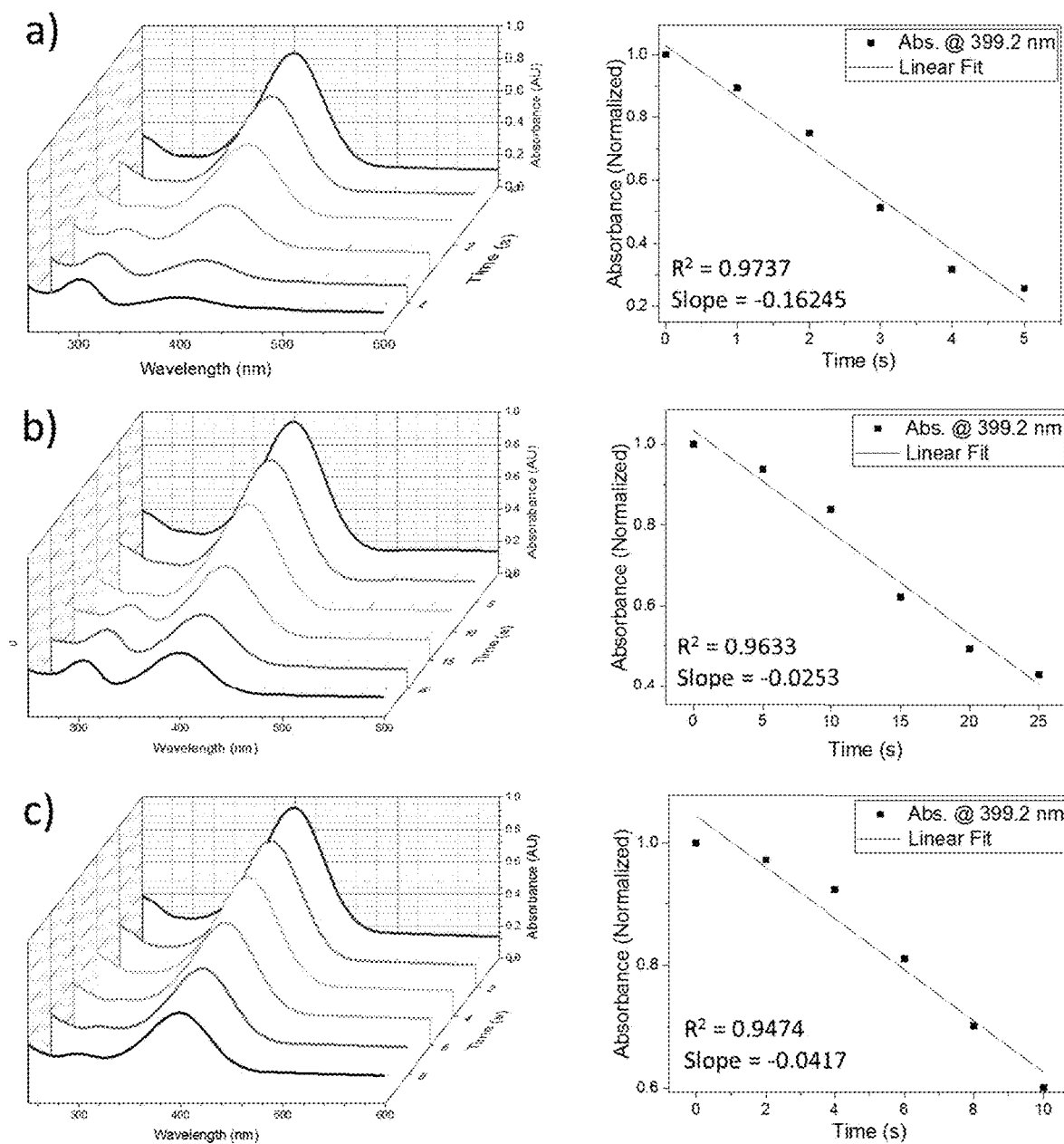
FIG. 15 illustrates catalytic performance of (a) rGO-AgNP, (b) rGO-AuNP and rGO-PdNP in the degradation of 4-Nitrophenol.
Figure 16:
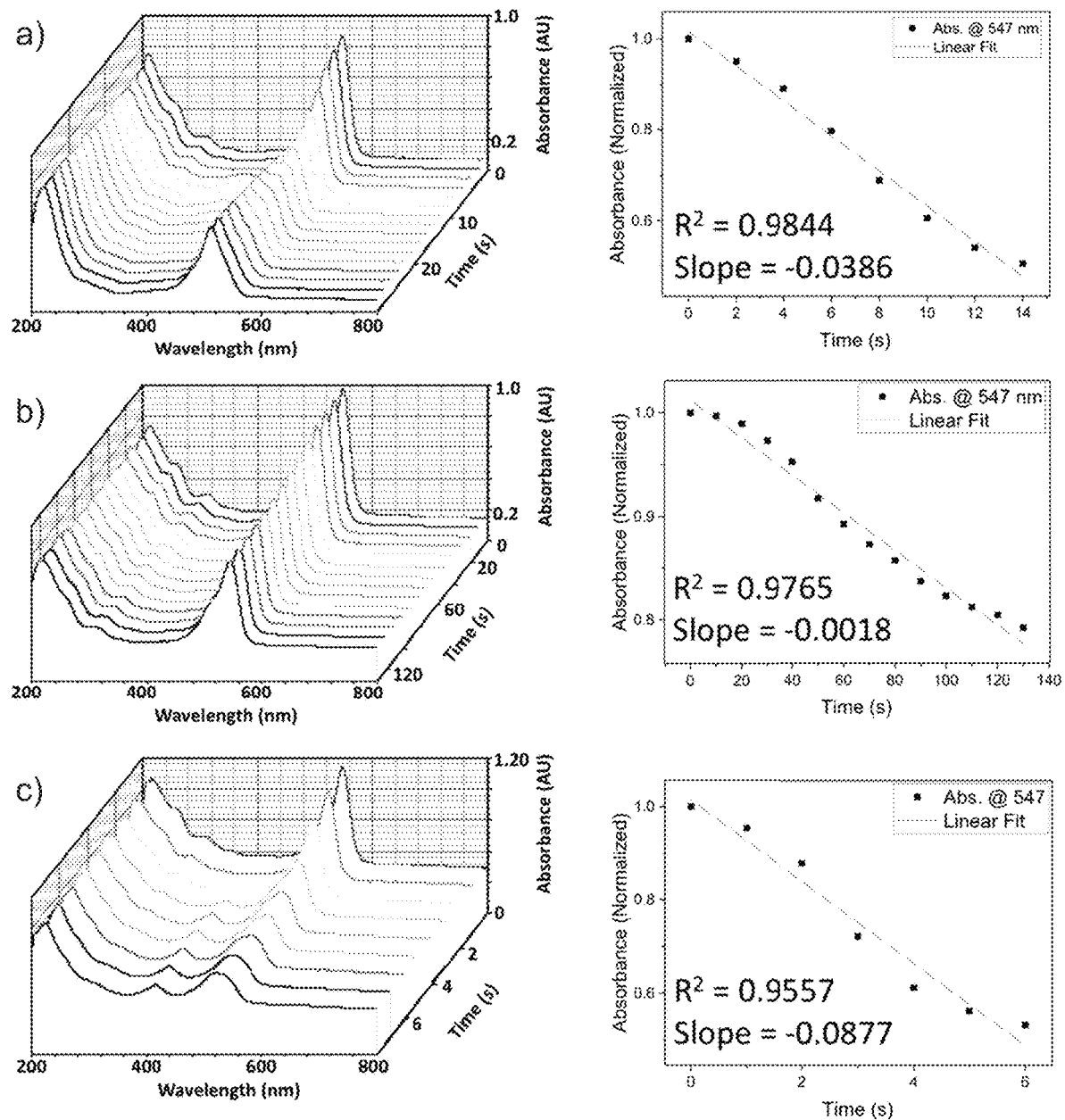
FIG. 16 illustrates catalytic performance of (a) rGO-AgNP, (b) rGO-AuNP and rGO-PdNP in the degradation of Rose Bengal.
Figure 17:
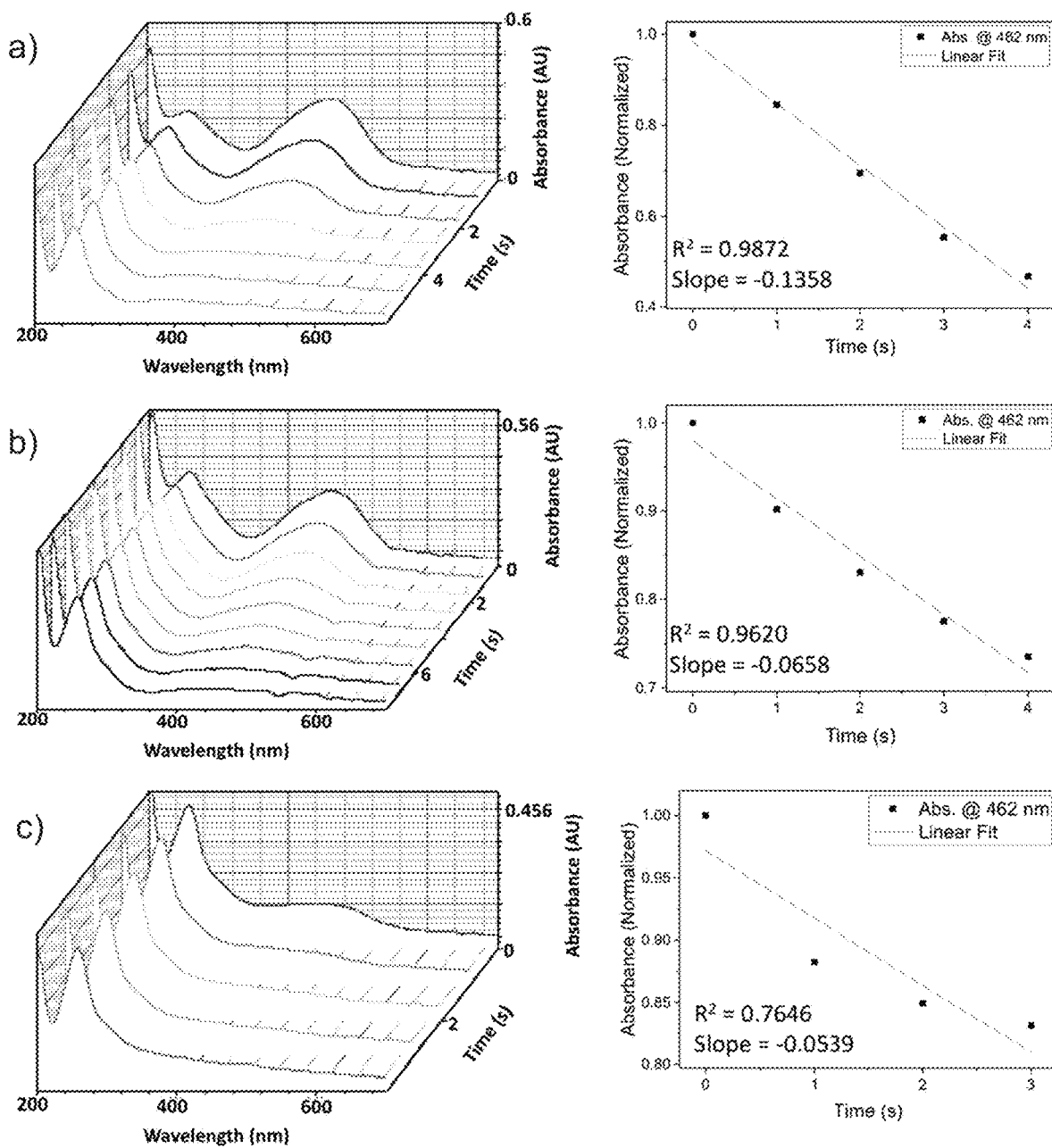
FIG. 17 illustrates catalytic performance of (a) rGO-AgNP, (b) rGO-AuNP and rGO-PdNP in the degradation of Methyl Orange.
Figure 18:
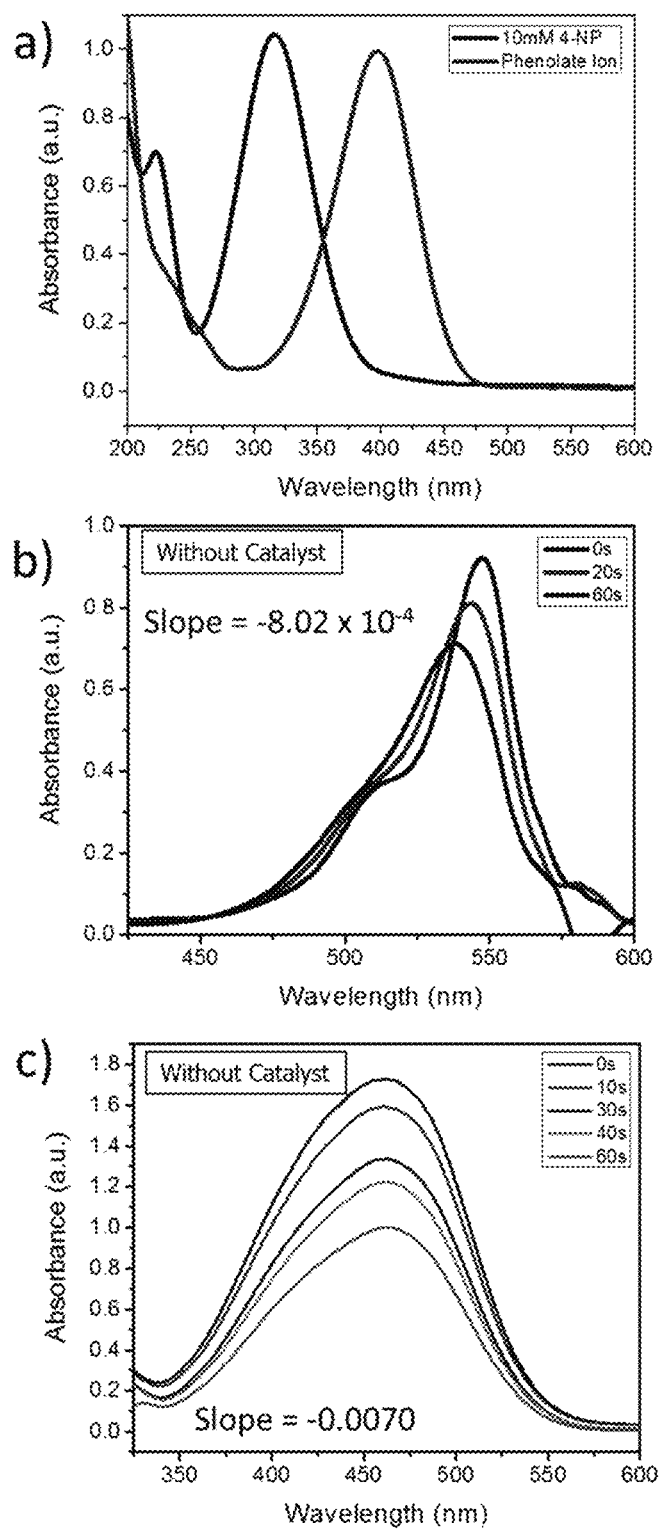
FIG. 18 illustrates UV-Vis absorbance of (a) 4-Nitrophenol and 4-nitrophenolate, (b) Rose Bengal and (c) Methyl Orange with $NaBH_4$ alone (w/o catalyst)

To demonstrate the ability of these graphene-metal nanoparticle hybrids in catalyzing the degradation of model environmental pollutants, we monitored the absorbance of the solution containing either 10 uL of 10 mM 4-nitrophenol (4-NP), Rose Bengal (RB) and Methyl Orange (MO), 2 mL of 10 mM $NaBH_4$ and either 50 uL of 0.5 mg/mL rGO- AgNP, rGO-AuNP and rGO-PdNP. FIG. 14a-c shows the catalytic performance of rGO-AgNP in the degradation of these selected model pollutants. The catalytic performance of rGO-AuNP and rGO-PdNP can be found in the FIGS. 15, 16 and 17. The catalytic reduction of 4-NP was monitored by the decrease of the peak at 400 nm (FIG. 14a). In the presence of $NaBH_4$, the absorbance peak of 4-NP formerly at ~317 nm redshifts to ~400 nm due to the formation of 4-nitrophenolate ion (FIG. 18a). On the other hand, the degradation of RB and MO was monitored by the disappearance of their absorption at 547 nm and 462 nm, respectively. We note that the degradation of RB and MO with $NaBH_4$ are chemically feasible, however the rates are rather slow as compared to the system treated with the rGO-AgNP, rGO-AuNP and rGO-PdNP (FIG. 18b-c).

Figure 19:
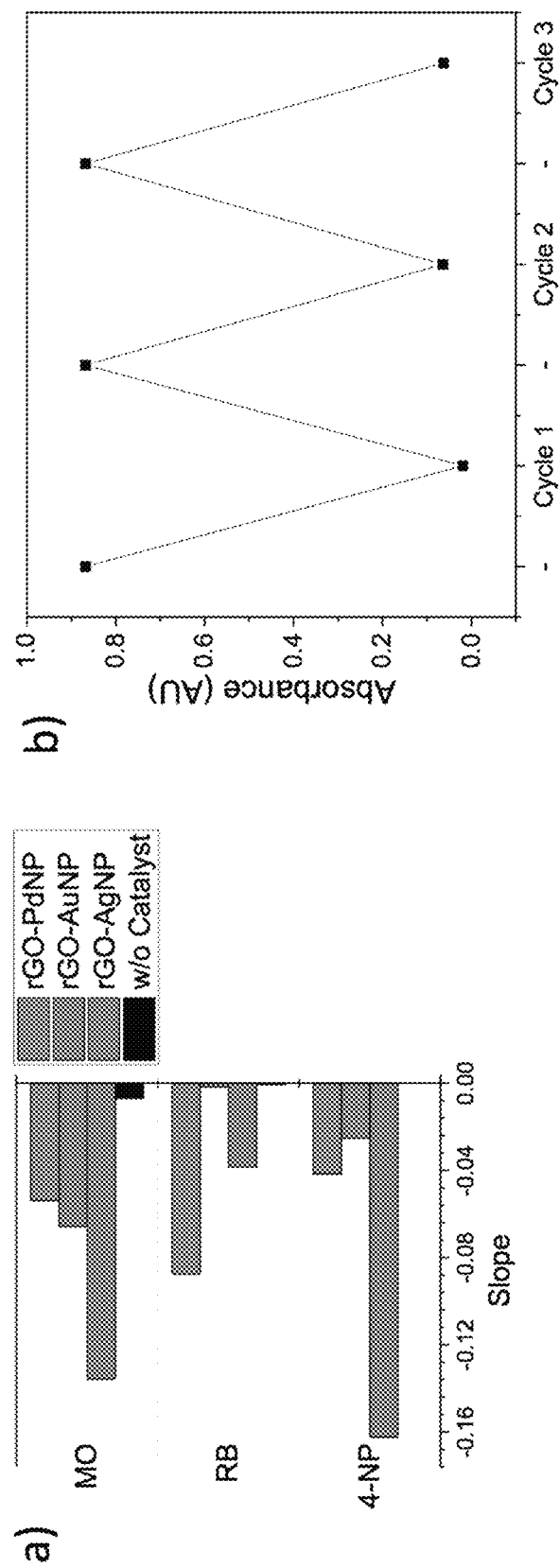
FIG. 19 is a summary of the catalytic performance of graphene metal nanoparticle hybrids in the degradation of 4-NP, RB and MO and (b) reusability of the rGO-AgNP for the catalytic reduction of 4-NP.

FIG. 19a summarizes the rate of degradation calculated from the slopes of the linear sections of the plot. Since the concentration of $NaBH_4$ for all three systems is so much larger than the model environmental pollutants (200 times), the reduction rate can be assumed to be independent of $NaBH_4$. Therefore, the catalytic rate constant can be calculated by assuming pseudo first-order kinetics with respect to 4-NP, RB and MO. In the future, one can study the effect of catalyst concentration in order to precisely determine the order of reaction. By evaluating FIG. 19a, it can be generalized that rGO-AgNP performed best followed by rGO-PdNP and rGO-AuNP. A possible reason for this observed trend may well be due to the size and density of NP on the surface of rGO. From FIG. 7, it can be observed that among the three, the AuNP has the biggest particle size and the lowest surface coverage or density. This means that the effective surface area of AuNP in rGO-AuNP is so much lower, resulting to lower catalytic rate. It is challenging to fundamentally rationalize the differences in the rate since a direct comparison is scientifically unsound at this point. GO in itself is polydisperse in size and the functionalities are randomly distributed throughout the entire sheet. Considering that no GO sheet is completely the same, an equal volume of rGO-AuNP (for example) of the same concentration may have different effective concentration of nanoparticles. Nevertheless, this experiment clearly shows that these metallic nanoparticles supported on the surface of graphene are active in catalyzing the degradation of 4-NP, RB and MO.

Figure 20:
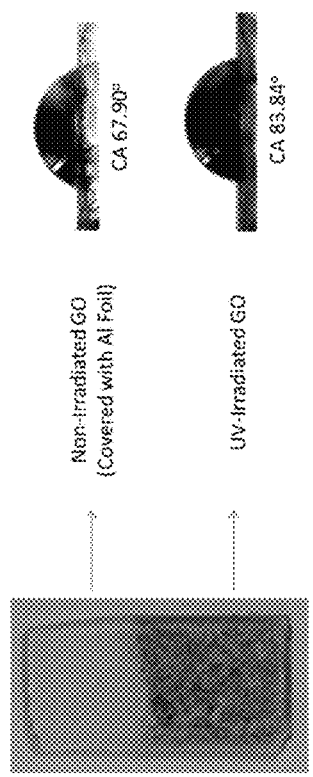
FIG. 20 illustrates an optical image and water contact angles of nanocomposites containing (a) PS, I-2959 and GO; and (b) PS, I-2959, GO and $Ag^+$.
Figure 20:
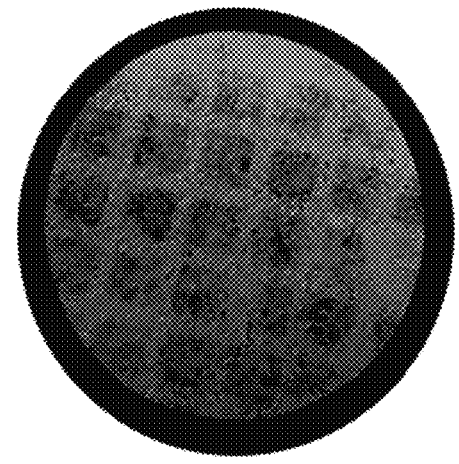
Figure 20:
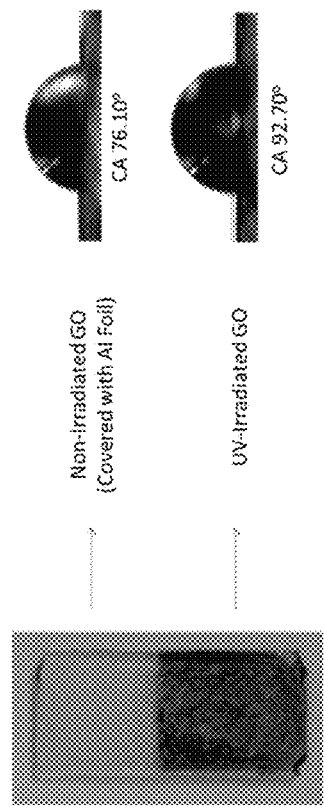
Figure 20:
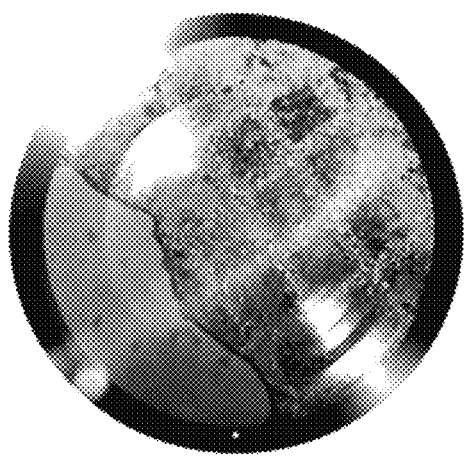

One of the advantages of catalysts in solid supports is reusability. To demonstrate this concept, we monitored the absorbance of the solution containing $NaBH_4$, 4-NP and rGO-AgNP. After the reaction, the rGO was sedimented by centrifugation and the sediment was used again up to 3 cycles. FIG. 19b clearly shows that rGO-AgNP is reusable for at least three times which suggests that it has a potential to be cost-effective and environment-friendly. Lastly, as a proof of concept, we also prepared polystyrene nanocomposites containing GO, $Ag^+$ and I-2959. FIG. 20 shows that the process described herein can afford the fabrication of nanocomposite films with discrete regions containing either rGO or rGO-AgNP.

Ketyl radicals based on I-2959 are effective reducing agents for GO. The use of photoreduction affords spatial and temporal control of the process. Graphene-metal nanoparticle hybrids of Ag, Au and Pd were also fabricated which showed promising action for the catalytic degradation of model environmental pollutants 4-Nitrophenol, Rose Bengal and Methyl Orange. Also, our initial catalysis study suggests that these graphene-nanoparticle hybrids are potentially reusable. The process described can be used to create polymer nanocomposites that can be photo-patterned and could and to fabricate plastic electronic devices.

Materials.

The reagents and organic solvents were purchased from Sigma Aldrich, Fisher Scientific, EMD, Strem Chemicals and Alfa Aesar. The dialysis tube was purchased from Thermo Fisher Scientific (3.5K MWCO). Milli-Q water with resistivity value of 18.2 M$\Omega$·cm was used throughout the entire procedure involving water as solvent. USA Standard Testing Sieve No. 80 and No. 100 from Fisher Scientific was also used during the purification process. All other solvents and chemicals were used without further purification.

Synthesis of Graphene Oxide.

GO was synthesized based on reported literature with some modification. Three grams of graphite flakes and 400 mL of concentrated $H_2SO_4$ was mixed in a 1000 mL round bottom flask for 10 min. Three grams of $KMnO_4$ was then slowly added to the reaction mixture which immediately turned dark green. Three more 3 g-portion of $KMnO_4$ was added to the reaction mixture every after 24 hours of mixing. The reaction was stopped after the four-day reaction period and 120 mL (~180 g) of the reaction mixture was mixed in 300 mL ice-water mixture. After which, 2 mL of $H_2O_2$ was slowly added turning the dark purple solution to bright yellow. The solution was centrifuged for 10 min at 4400 rpm. The supernate was discarded and the sediments were washed with Milli-Q water once followed by centrifugation. The next series of purification step was performed using isopropanol until pH was neutral. The sediments were then sieved using No. 80 and No. 100 USA Standard Testing Sieve. The final sediment wash dialyzed for 3 days in isopropanol using 3.5K MWCO dialysis tube. After which, the solids were collected by centrifugation at 10000 rpm for 30 minutes. Graphite oxide solids were obtained by vacuum evaporation. To exfoliate graphite oxide, 100 mg of GO in 10 mL THF solution was ultrasonicated for 5 min.

Photoreduction Studies.

In a typical experiment, a solution of HMP (20 mM) and GO (1 mg/mL) is placed in a glass vial with a stir-bar. This is then photo-irradiated using Honle Bluepoint 4 Ecocure irradiation set-up with a single light guide. A 320-390 nm filter was used on all irradiation experiments. The distance of the light guide to the film was optimized to 200-500 mW/cm$^2$ power density. After the reaction, the solution was centrifuged to collect the sediments. It was then re-dispersed in THF and centrifuged for 6 cycles in order to purify the product. For graphene metal nanoparticle hybrids, 300 μL of 10 mg/mL GO solution was added to a 3 mL solution of 20 mM HMP and 10 mM metal precursors ($AgCF_3SO_3$, $HAuCl_4$, $(C_6H_5CN)_2PdCl_2$). These were then irradiated for 10 min using previously described irradiation parameter. The same purification procedure was performed.

Photo-Patterning.

A solution containing equal volumes of 0.5 mg/mL GO in THF and 20 mM HMP in THF was casted on a 1×2 cm$^2$ glass substrate. After drying, a 200 mesh copper grid was placed on top of the GO-HMP thin film followed by UV irradiation for 3 min. Then, an acetone solution of 5 wt % PMMA and 0.02 wt % of fluorescein was deposited on top of the patterned substrate by spin-coating for 1 min at 5000 rpm. The fluorescence images of the photo-patterned films were then acquired via laser scanning fluorescence confocal microscopy using a Leica TCS SPE Confocal Microscope.

Catalysis and Reusability One of the Advantages of Catalysts in Solid supports or heterogeneous catalysis in general is reusability.

To demonstrate this concept, we prepared 1 mL solution of 10 mM NaBH4 and 10 uL 4-NP in a 1.5 mL eppendorf tube. We then added 0.5 mL of 0.5 mg/mL rGO-PdNP which resulted to immediate discoloration of the solution. The mixture was subjected to vortex mixing for 10 s to ensure complete reaction. It was then centrifuged for 13,000 rpm for 1 min.

Instrumentation.

The UV-Vis absorbance of the starting materials as well as the products were recorded by StellatNet UV-Vis-NIR spectrometer and the fluorescence spectra were obtained on a Perkin-Elmer LS-45 luminescence spectrometer. The Raman spectra was collected BWTek I-Raman Plus equipped with a video microscope Raman sampling system. A 25× objective was used to focus the 532 nm laser. The TEM images were obtained on Zeiss Libra 200EF electron microscope operating at 200 kV. On the other hand, XPS analysis was conducted on a PHI Versaprobe 5000 scanning x-ray photoelectron spectrometer equipped with monochromatic Al Kα x-ray source (hv=1486.6 eV) with a 1800 hemispherical energy analyzer. The spectra were surveyed from 0-1100 eV and were collected with pass energy of 94 eV. Moreover, high resolution scans for C, O, Ag, Au and Pd were also collected with 23.5 eV pass energy. The spectra were processed by Multipak V7.0.1 and deconvoluted using MagicPlot Student version 2.5. The WAXS patterns of Kapton coated samples were collected from Bruker AXS H-STAR area detector.

The materials of the invention are attractive for real-world applications as they can be easily integrated in polymer supports. As an example, a polystyrene composite film was fabricated from a composition comprising graphene oxide, silver precursor and HMP by dropcasting. Even in a solid-state, the reduction and nanoparticle formation is also achieved. The readily apparent darkening and "yellowing" of the irradiated portion of the film suggests successful reduction of both graphene oxide and silver nanoparticle, see FIG. 8. Water contact angle measurements also suggest successful reduction, see FIG. 8. Photo-patterning of composite films using a 200-mesh TEM grid photomask was produced. FIG. 8 shows the optical image of a free standing film with well-defined reduced regions containing silver nanoparticle-decorated graphene.

In summary, the methods described herein afford the simple fabrication of graphene supported metal nanoparticles by simple photo-irradiation. Graphene oxide and metal precursor are simultaneously reduced by the action of photogenerated ketyl radicals. The photoreduction is also possible in polymer composite films. This material has applications in the area of catalysis, sensing, electronics, flexible electronics, optics, packaging, antimicrobials, stretchable electronics, inks, and energy-related uses.

What is claimed is:

1. A method for photoreducing graphene oxide, comprising the steps of:
   obtaining a composition comprising graphene oxide and a photoinitiator;
   irradiating the composition with UV radiation thereby reducing the graphene oxide.

2. The method according to claim 1, wherein the UV radiation intensity ranges from 10-100 mW/cm$^2$ for 10-60 min at ambient temperature and pressure.

3. The method according to claim 2, wherein the photoinitiator comprises 2-hydroxy-4'-(2-hydroxyethoxy)-2-methylpropiophenone.

4. The method according to claim 1, wherein the UV radiation is applied to the graphene oxide and photoinitiator in solution.

5. The method according to claim 1, wherein the UV radiation is applied to the graphene oxide and photoinitiator in solid-state.

6. The method according to claim 1, wherein the UV irradiation is applied to the graphene oxide and photoinitiator in the presence of a polymer.

7. The method according to claim 6, wherein the polymer comprises one or more of polystyrene, thermoplastic polyurethane (TPU), poly[oligo(ethylene glycol) methyl methacrylate] (PEGMEMA) and a cellulose nanomaterial.

8. The method according to claim 1, wherein the composition further includes a metal salt that co-reduces to a corresponding metal nanoparticle that is grafted on the surface of the reduced graphene oxide.

9. The method according to claim 8, wherein the metal salt comprises one or more of $AgCF_3SO_3$, $HAuCl_4$ and $(C_6H_5CN)_2PdCl_2$.

10. The method according to claim 1, further including the step of providing a mask prior to application of the UV radiation such that a pattern is produced.

* * * * *